United States Patent [19]

Gadelkarim et al.

[11] Patent Number: 5,768,479
[45] Date of Patent: Jun. 16, 1998

[54] CIRCUIT LAYOUT TECHNIQUE WITH TEMPLATE-DRIVEN PLACEMENT USING FUZZY LOGIC

[75] Inventors: George J. Gadelkarim, Pleasanton; Ted Vucurevich, San Jose; William H. Kao, Saratoga, all of Calif.

[73] Assignee: Cadence Design Systems, Inc., San Jose, Calif.

[21] Appl. No.: 710,359

[22] Filed: Sep. 17, 1996

[51] Int. Cl.$^6$ .................................................. G06F 15/18
[52] U.S. Cl. ................................. 395/50; 395/61
[58] Field of Search ...................... 359/377; 364/490, 364/491, 488, 50; 395/50, 51, 60–61, 75–77, 10

[56] References Cited

U.S. PATENT DOCUMENTS

| | | | |
|---|---|---|---|
| 5,308,798 | 5/1994 | Brasen et al. | 437/250 |
| 5,579,772 | 12/1996 | Kinukawa et al. | 128/665 |

OTHER PUBLICATIONS

Lin, Rung–Bin, et al., Fuzzy Logic Approach To Placement Problem, 29th ACm/IEEE, Design Automation Conference, Paper 9.3, pp. 153–158.

Kong, Seong–Gong, et al., Neural Networks And Fuzzy Systems—A Dynamic Approach To Machine Intelligence, Chapter 10: Fuzzy Image Transform Coding, pp. 363–378, Prentice Hall, 1992.

Pacini, Peter, et al., Neutral Networks And Fuzzy Systems—A Dynamic Approach To Machine Intelligence, Chapter 11: Comparison of Fuzzy and Kalman–Filter Target–Tracking Control Systems, pp. 379–406, Prentice Hall, 1992.

Kirkpatrick, S., et al., Optimization By Simulated Annealing, Science, vol. 220, No. 4598, 13 May 1983, pp. 45–54.

Kang et al., "Fuzzy Logic Approach to VLSI Placement," IEEE Transactions on VLSI Systems, V.2, No. 4, p. 489–501, Dec. 31, 1994.

Mehranfar, "STAT: A Schematic To Artwork Translator For Custom Analog Cells," Custom Integrated Circuits Conf. p. 30.2.1–30.2.3, Dec. 31, 1990.

*Primary Examiner*—Tariq R. Hafiz
*Attorney, Agent, or Firm*—Townsend and Townsend and Crew LLP

[57] ABSTRACT

A method for generating a physical integrated circuit layout, using the similarity between a template and the physical layout as a metric. This automated template-driven layout methodology creates a physical integrated circuit layout which approximates the specified template as closely as practicably possible. The similarity of the positioning of circuit elements in a physical layout is improved with regard to the positioning of those same circuit elements in a template. The circuit elements' placement is incrementally improved by attaching a cost to each placement, with a lower cost reflecting a better match between circuit element placement in the physical layout and the template. Fuzzy logic concepts are employed to determine the cost of a given layout.

48 Claims, 13 Drawing Sheets

CIRCUIT LAYOUT TECHNIQUE WITH TEMPLATE-DRIVEN PLACEMENT USING FUZZY LOGIC

BACKGROUND OF THE INVENTION

The present invention relates in general to computer aided design (CAD) tools used for design and development of integrated circuits. In particular, this invention relates to an automated template-driven layout methodology that creates a physical integrated circuit layout which approximates a specified template (e.g., a schematic layout) as closely as practicably possible.

An overview of a typical design process for integrated circuits is shown in the flow diagram of FIG. 1. The process can be generally divided into a front-end design phase (top part of the flow diagram) and a back-end development phase (bottom part of the flow diagram). During the front-end phase, from a set of specifications, the engineer designs and develops a logical representation of the circuit in the form of a circuit schematic (step 100). The schematic is then entered on computer workstation from which a circuit netlist is generated (step 102). The netlist defines the entire circuit including all its components and their interconnections. Alternatively, the circuit information may be developed using a hardware description language (HDL) and synthesis. With the aid of circuit simulation tools available on the workstation, the designer then simulates the functionality of the circuit (step 104). The circuit simulation process may involve several iterations of design modifications and improvements until the circuit design is fine tuned and finalized.

The back-end development involves several steps during which a final circuit layout (physical description) is developed based on the circuit schematic. During placement (step 106), various circuit building blocks (or cells) as defined by the finalized circuit schematic are generally placed within a predefined floor plan. For integrated circuits designed based on array or standard cell technology, the various circuit building blocks are typically predefined and made available in a cell library. Placement is followed by a routing step 108 during which interconnects between circuit elements are routed throughout the layout. Finally, the accuracy of the layout versus the schematic is verified (step 110), and if no errors or design rule violations are found, the circuit layout information is used for the process of fabrication (step 112).

For moderately sized analog circuits, the back-end process often relies on the expertise of a layout engineer to improve the layout after the initial place and route steps. Part of this process is to take into account the requirements of the front-end designers who are often more familiar with the performance issues involved in a particular design. This includes requirements such as the position of circuit elements in the schematic, which are positioned in the schematic as they should be, ideally, in the final layout. For this reason, the common practice in analog circuit design has been to require that circuit elements' relative positions in the layout match their relative positions in the schematic. This is due to the greater sensitivity of analog circuit designs to physical device placement and is known as schematic-driven placement. Schematic driven placement is a subset of the template driven placement technique which is the subject of the present invention.

Parameters taken into consideration by the schematic designer include logical connectivity, cross-talk and circuit parasitics. The layout engineer therefore inspects the results of the routing step, makes adjustments and restarts the placement and routing routine, in part to meet these requirements. For example, if the placement method has situated logically adjacent circuit elements such that they are physically separated by a large distance, the layout engineer may have to ensure the components are placed more closely together by constraining the positioning options available to the layout system. This process may need to be repeated numerous times depending on the success of each iteration.

As noted, front-end designers are greatly interested in a layout in which the devices' relative schematic positions are closely mirrored by the circuit's physical layout. The simplest way to fulfill this requirement is to scale the schematic to a suitable size and replace the schematic instances with the corresponding instances of physical devices. Such an exact mapping is fraught with difficulties, as other performance requirements can make a layout precisely mirroring the schematic impractical. For example, thermal matching requirements and the use of linear arrays (also called analog master slices), often impose constraints due to restricted device locations. Under these circumstances, direct scaling is unworkable and more intelligent layout techniques become necessary.

Thus, for larger and more complex circuits, the back-end steps of place and route often result in layouts which poorly reflect the intent of the schematic designer. The iterative process described requires manual customization and so tends to be quite time consuming, error prone, and may still result in only improving one area's similarity to the schematic at the expense of another's. The results can also depend heavily on the layout engineer's abilities. The existing approach thus suffers from longer turnaround times and, often, a layout which poorly reflects the schematic design. Given a layout-sensitive schematic design that situates the circuit elements in the most logical fashion, circuit layouts which do not substantially mirror the circuit's schematic translate into increased layout area and congestion, and diminished circuit performance.

More generally, there are other situations in which matching a layout to a given pattern is desirable. Such patterns serve as templates for the desired final layout. One example is process migration. When a design is migrated to a process having a smaller feature size (and thus different layout rules), it is desirable to have the new layout conform as closely as possible to the old layout to provide more predictable behavior in the new circuit. Another example is design modifications. Incremental changes must often be made to digital designs to permit them to function properly in their physical implementation. This includes adding circuit elements such as transceivers to increase signal-to-noise ratios and buffers to reduce delay. There is therefore a need for a circuit layout technique which creates a physical layout accurately reflecting the arrangement of elements on a given template (i.e., the previous layout, this example).

SUMMARY OF THE INVENTION

The present invention provides an automated method of generating a physical integrated circuit layout, using the similarity between a template (such as a schematic or previous physical layout) and the new physical layout as a metric. This automated template-driven layout methodology creates a physical integrated circuit layout which approximates the specified template as closely as practicably possible.

Broadly, the present invention provides a method for improving the similarity of the positioning of circuit elements in a physical layout with regard to the positioning of those same circuit elements in a template. The circuit elements' placement is incrementally improved by attaching a cost to each placement, with a lower cost reflecting a better match between circuit element placement in the physical layout and the template. Fuzzy logic concepts are employed in this application to determine the cost of a given layout.

Accordingly, in one embodiment, the present invention provides a method for improving layout efficiency for integrated circuits. Initially, a first and second circuit element are selected from the several circuit elements of which the design consists. Next, differentials between the first and second circuit elements' placement are computed for both the layout and the template. These differentials are compared to arrive at a placement cost for the physical layout placement of the second circuit element with respect to the first circuit element. A different second circuit element is then selected from the remaining possible circuit elements and the above steps are repeated. These remaining (unselected) circuit elements may represent the entire set of circuit elements, or just the circuit elements in the immediate neighborhood surrounding the first circuit element. Once all possible circuit elements have been analyzed with respect to the current first circuit element, a new circuit element is selected as the (current) first circuit element, and the process repeated. This continues until all circuit elements have been selected as the first circuit element.

In another embodiment, the present invention provides a method for improving the similarity of the positioning of a plurality of circuit elements in a physical layout to the positioning of the plurality of circuit elements in a template. The method begins by pre-processing the plurality of circuit elements in the template. This includes: (a) generating a list of circuit element pairs, each one of the circuit element pairs including a first circuit element and a second circuit element; (b) selecting a circuit element pair from the list of circuit element pairs; (c) analyzing the circuit element pair to determine neighborhood information for the first and the second circuit elements of the circuit element pair; and (d) repeating steps (b) and (c) for all circuit element pairs. Once this pre-processing is complete, the current placement of the plurality of circuit elements in the physical layout are evaluated with regard to the positioning of the plurality of circuit elements in the template. An overall placement cost is thus determined for the current placement of the plurality of circuit elements in the physical layout. The analysis starts by selecting a first and second circuit element from the several circuit elements of which the design consists. Next, differentials between the first and second circuit elements' placement are computed for both the layout and the template. These differentials are compared to arrive at a placement cost for the physical layout placement of the second circuit element with respect to the first circuit element. A different second circuit element is then selected from the remaining possible circuit elements and the above steps are repeated. These remaining (unselected) circuit elements may represent the entire set of circuit elements, or just the circuit elements in the immediate neighborhood surrounding the first circuit element. Once all possible circuit elements have been analyzed with respect to the current first circuit element, a new circuit element is selected as the (current) first circuit element, and the process repeated. This continues until all circuit elements have been selected as the first circuit element A better understanding of the nature and advantages of the present invention may be had with reference to the diagrams and the detailed description below.

DESCRIPTION OF SPECIFIC EMBODIMENTS

Figure 1:
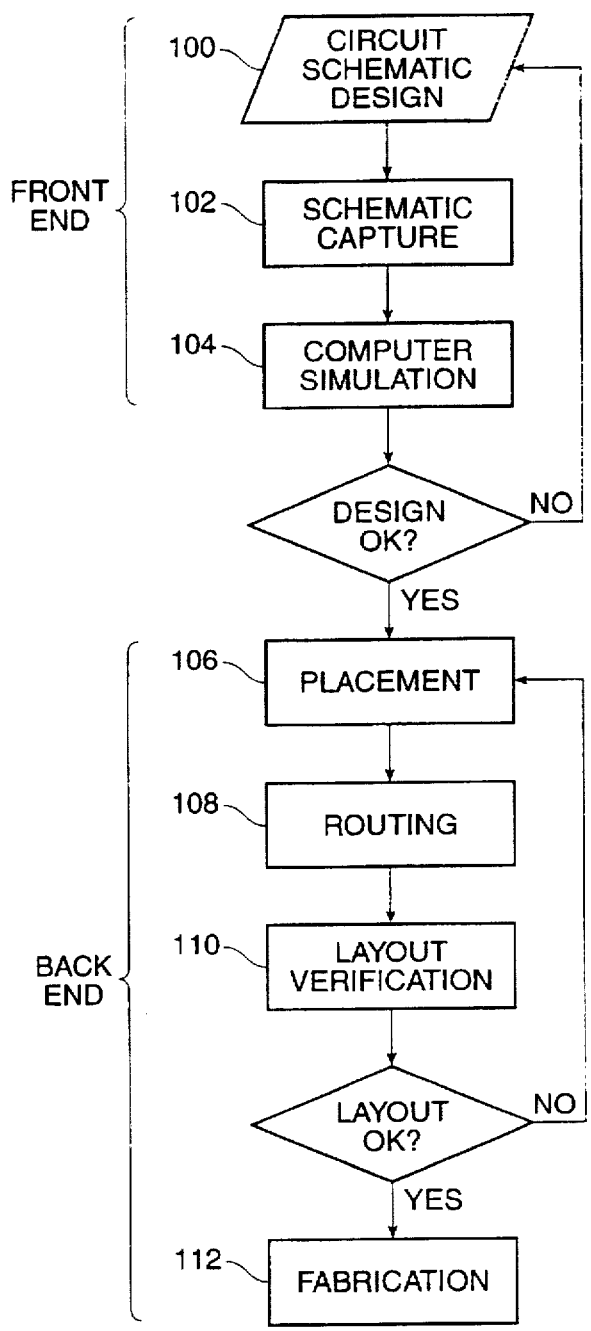
FIG. 1 is a high-level flow diagram of the process of designing and developing integrated circuits.
Figure 2:
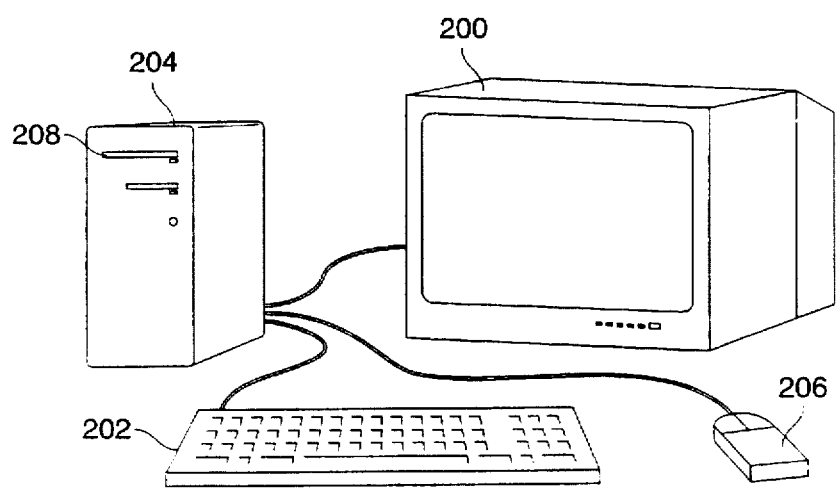
FIG. 2 shows an exemplary CAD workstation wherein the present invention resides.

The method and technique of the present invention is implemented within a CAD environment and typically resides on a storage medium inside a computer workstation having engineering design capabilities. FIG. 2 shows a typical example of a computer workstation which houses various CAD modules such as circuit simulation and layout tools and the like. The workstation includes monitor 200, keyboard 202, cabinet 204 and mouse 206. Cabinet 204 houses a CD-ROM drive 208 or a hard drive (not shown) which may be utilized to store and retrieve CAD tools incorporating the present invention, digital images for use with the present invention, and the like. Although a CD-ROM 208 is shown as the removable media, other removable tangible media including floppy disks, tape, and flash memory may be utilized. Cabinet 204 also houses familiar computer components (not shown) such as a processor, memory, and various support network elements that execute CAD modules. The computer workstation shown in FIG. 2 is but an example of a computer system suitable for use with the present invention. Other configurations of subsystems suitable for use with the present invention will be readily apparent to one of ordinary skill in the art.

The method of the present invention provides an automatic placement technique which provides a template-driven physical placement by adding template-driven placement to an iteration-based placement technique such as simulated annealing. For exemplary purposes only, a simulated annealing optimization technique is described herein as a framework within which to discuss the present invention. This template-driven placement is achieved by adding a new term to the cost function of the iterative technique that penalizes a lack in resemblance between the template and the design's physical layout. This cost is computed using a fuzzy logic-based function. The technique may also support placement criteria such as area, aspect ratio, wire length and other layout constraints. Because the goal of such an optimization process is minimization of the overall cost of the physical layout, the process attempts to minimize the weighted sum of the different terms including the template-to-layout scores (i.e., costs). Thus, the final outcome tends to make the layout topology (or relative placement) match that of the template as much as possible, in light of the given design constraints.

The problem of template-driven placement may be viewed as a pattern-mapping problem. A method is required that allows comparison of two patterns and yields a score representing the degree of resemblance between the two patterns (i.e., a cost function). Fuzzy logic techniques are applicable to this type of problem because they allow such comparisons to be made.

Figure 3:
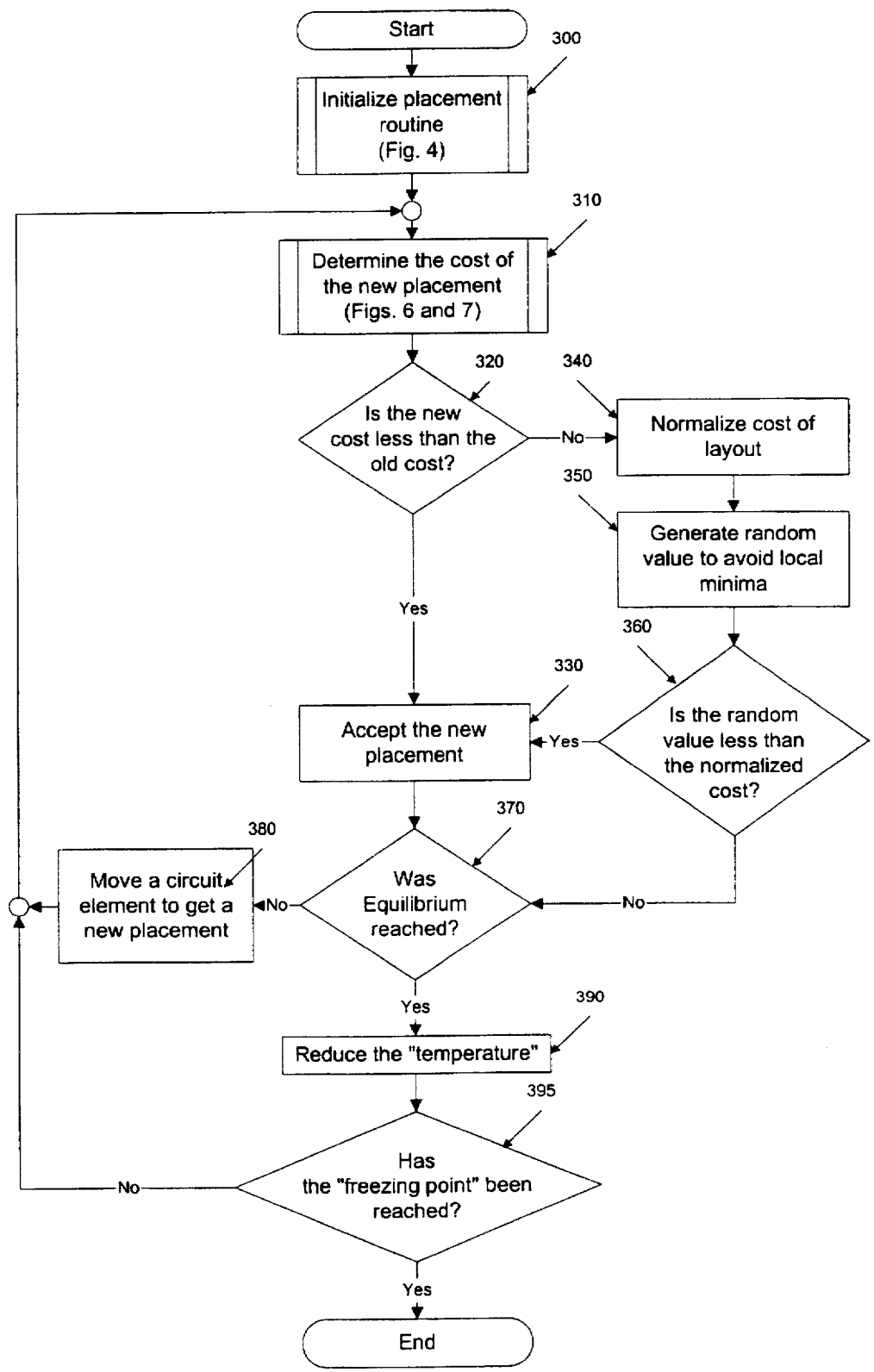
FIG. 3 is a flow diagram showing the various steps of an optimization process which includes the method of the present invention.

FIG. 3 illustrates the steps which may be followed in a simulated annealing process employing the method of the present invention. The steps of the simulated annealing process shown are provided only as an example. The invention should not be limited by the steps shown, as they are provided only as a framework to allow a better understanding of the method of the present invention. The simulated annealing process begins with the initialization of the placement routine at step 300, which is further described in connection with FIG. 4. The output of the initialization routine is an initial physical layout which serves as the input to step 310. At step 310, the cost of the current physical placement is determined. Cost, in this sense, indicates the degree to which the designer's objective have been met. The higher the cost, the less satisfactory is the given physical layout, in terms of the design criteria. This step is further described in FIGS. 6 and 7. The new cost is then compared to the cost of the previous placement at step 320. The cost of the previous placement is initialized to an arbitrarily high cost for the first iteration to ensure that the initial placement is accepted (as no previous placement exists for the first iteration). If the new cost is less than the previous cost, the new placement is accepted at step 330. If the new cost is not less than the old cost, the process continues to step 340, where the cost of the new layout is normalized. At step 350, a random value is generated. Steps 340 and 350 are performed to avoid local minima. Once the random value is generated, the process determines whether the random value is less than the normalized cost of the new layout at step 360. If the random value is less than the normalized cost, the new placement is accepted at step 330. Otherwise, the new placement is rejected and the process continues.

At step 370, the process determines whether the process of repositioning circuit elements has reached equilibrium, indicating that no less-costly placement exists at the current temperature. If equilibrium has not been reached, the process continues to step 380, where one or more circuit elements are repositioned to generate a new placement. Upon reaching equilibrium, the simulated temperature is reduced by a predetermined amount at step 390. The current simulated temperature is then compared to the simulated freezing point at step 395. The process stops if the temperature fallen below the freezing point. At this point, the physical layout generated is as close to being optimal as the process may reasonably be expected to generate. If the simulated temperature is still above the simulated freezing point, the process continues (step 310).

Figure 4:
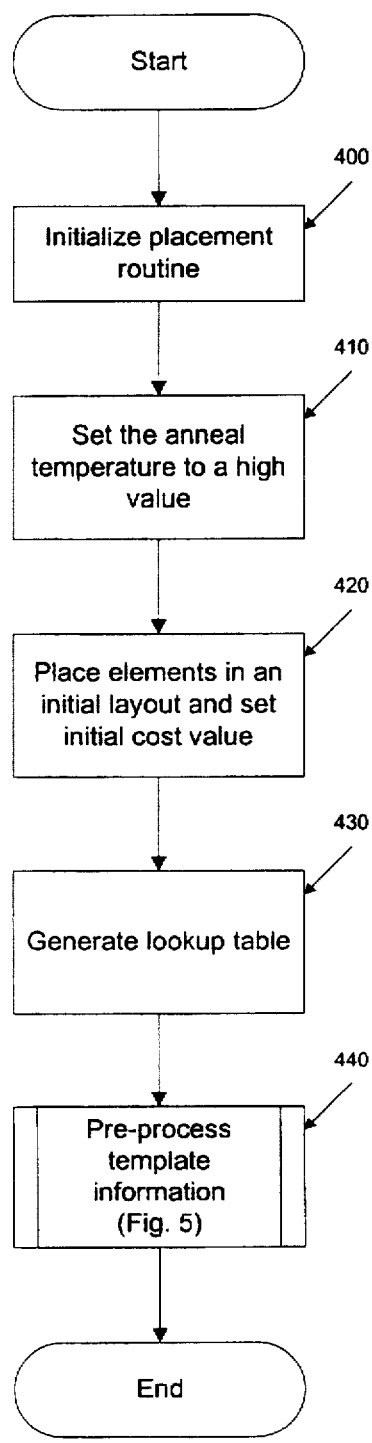
FIG. 4 is a flow diagram showing the initialization step of FIG. 3 in greater detail.

The initialization indicated at step 300 in FIG. 3 is more fully described in FIG. 4. Referring to FIG. 4, the placement routine is first initialized at step 400. This includes initialization of variables and other housekeeping activities. At step 410, as noted earlier, the anneal temperature is set to an arbitrarily high value to ensure that the initial placement is accepted. At step 420, circuit elements are placed in an initial layout and an initial cost value is generated for that layout. A lookup table (LUT) is generated at step 430. Alternatively, the process of generating the LUT may be performed separately from the pre-processing step. For example, the LUT might be generated independently of the process shown in FIG. 4, and made available to the costing routine (step 310 in FIG. 3) as a table of constants or the like. The LUT is generated to reduce the computational load which would otherwise be subsequently encountered in determining the template-match cost. At step 440, template information is preprocessed, as is further described in FIG. 5. Pre-processing is performed to reduce the computational complexity of the required calculations.

Figure 5A:
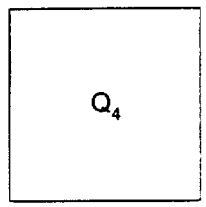
FIG. 5 is a flow diagram showing the pre-processing step of FIG. 4 in greater detail.
Figure 5A:
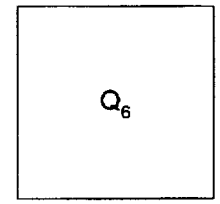
Figure 5A:
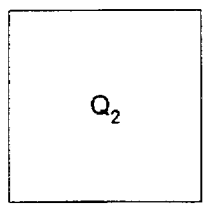
Figure 5A:
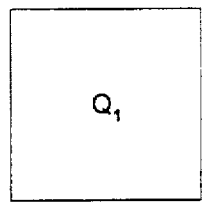
Figure 5A:
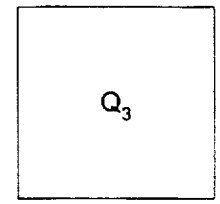
Figure 5A:
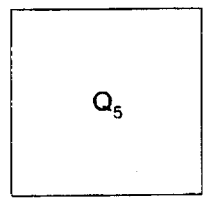
Figure 5B:
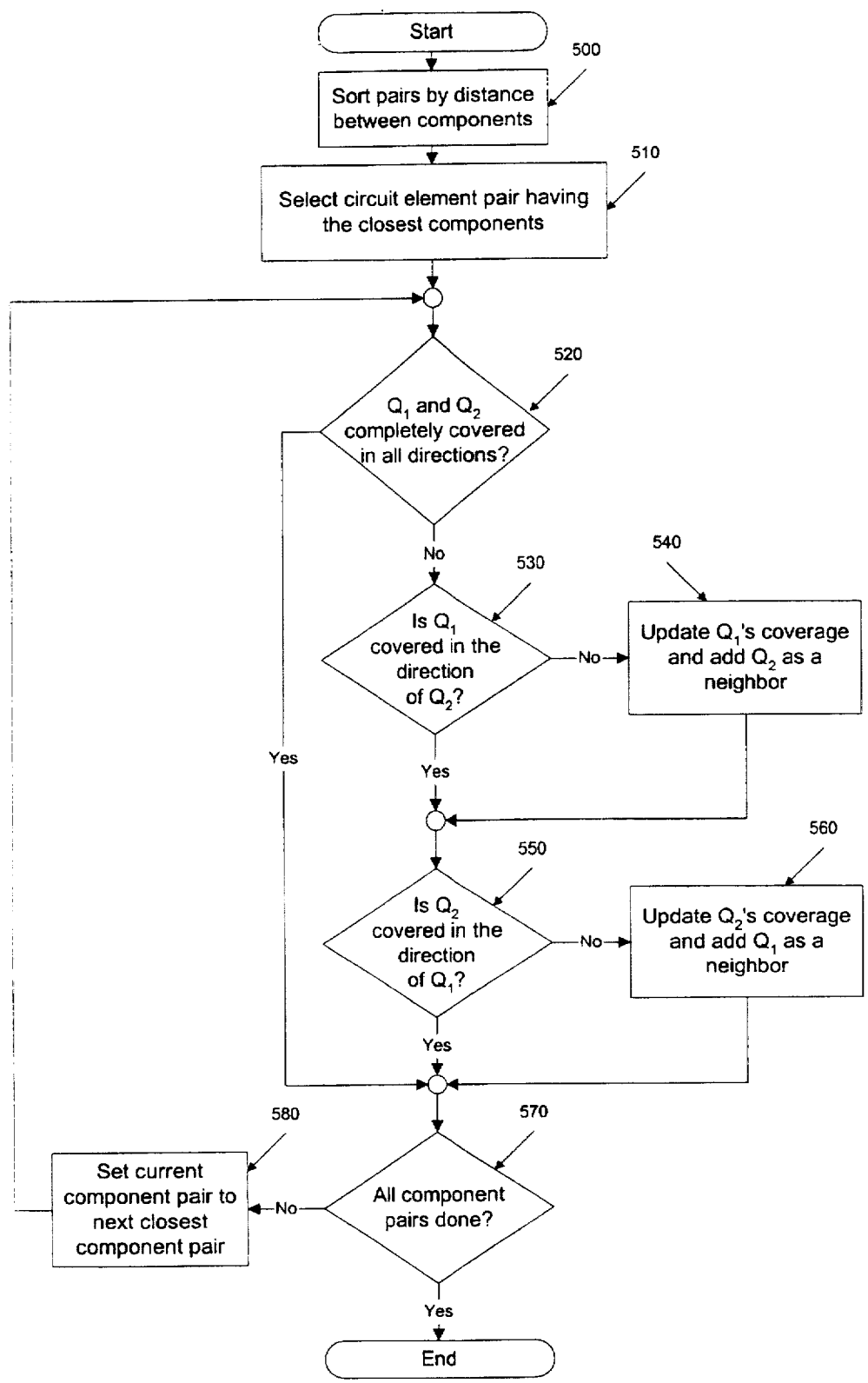

The pre-processing performed according to the method of the present invention is illustrated in FIGS. 5A and 5B. Because the method of the present invention defines a component's position in terms of the position of other components, one approach would be to compute the position of a component relative to every other component in the circuit. However, this would be computationally intensive. A better solution, and a preferred embodiment according to the present invention is to choose only a subset of the remaining components when defining a component's position. Using this method, only the components within a given neighborhood of each component in the template are chosen. The particular components chosen as neighbors may vary depending on the circuit's topology and the neighborhood's radius. The neighborhood's radius is defined in terms of the number of neighbors encountered when proceeding out from the neighborhood's center (the position of the given component) to the edge of the neighborhood. Thus, the components closest to the given component are examined first. However, because components are not usually positioned in a uniform, regular fashion, the definition may be simplified to cover only major directions (e.g., above, below, left and right).

A direction is covered when an element of the vector between the given and selected components is in that direction. Coverage is complete when the sum of the vector elements in the given direction exceed the radius. For example, in trying to compute the neighbors of a component $Q_1$, the neighborhood may be defined as a circle with a radius of 1. This is illustrated in FIG. 5A. When a device is directly to the left of $Q_1$ (e.g., $Q_2$) or right of $Q_1$ (e.g., $Q_3$), or when directly above $Q_1$ (e.g., $Q_4$) or below $Q_1$ (e.g., $Q_5$) the coverage thus provided to $Q_1$ is 1. When a device covers two directions (e.g., above and to the right (e.g., $Q_6$)), the contribution to each direction is partial such that the total contribution is 1. So, for a component situated above and to the right of $Q_1$, its contribution to $Q_1$'s coverage is 0.5 in the above and right directions. For $Q_1$ to have complete coverage in all directions, the collective contributions of all the devices in the neighborhood should equal or exceed the chosen radius in all directions. When one direction reaches the target radius value, there is no need to continue looking for neighbors in that direction. So for $Q_1$ in FIG. 5A, components $Q_2$, $Q_3$, $Q_4$ and $Q_5$ provide total coverage for $Q_1$, without need of $Q_6$.

The process described above begins by sorting the relative positions of components by pairs at step 500. This sorting orders the component pairs by the two components's proximity. At step 510, the process begins sorting through the component pairs by selecting the circuit element pair which are the closest together. Thus, a component's nearest neighbors are used first in determining the component's neighborhood. At step 520, the coverage of each of the components in each component pair is determined. Both components in the current component pair, represented by $Q_1$ and $Q_2$, are examined to determine whether neighbors above, below, to the right, and to the left have been determined. If no neighbors have been selected for any of these directions or combination of directions, the process continues to step 530.

At step 530, information regarding $Q_1$'s neighbors is analyzed to determine whether all of the major directions in the direction of $Q_2$ are completely covered. If $Q_1$ does not have complete coverage in one or more of these directions, $Q_1$'s coverage is updated and $Q_2$ is added as a neighbor at step 540. Coverage is calculated by assigning a value of 1 if $Q_2$ is to the right of or above $Q_1$, and $-1$ if $Q_2$ is to the left of or below $Q_1$. If the components overlap, a value between $-1$ and 1 is returned. The amount of overlap may be calculated in any one of a number of manners. In a preferred embodiment, overlap in the X direction is calculated by dividing the width of the overlapping region by the width of the smaller component. This overlap value is then subtracted from one. If the centerline of the smaller component is to the left of the centerline of the larger component, the resulting number is multiplied by $-1$. The function's value thus becomes 0 when the two devices have the same X coordinate, and approaches 1 and $-1$ at the extremes.

If $Q_1$ already has coverage in the direction of $Q_2$, the process continues to step 550. If $Q_1$'s coverage has been updated regarding $Q_2$, the process also continues to step 550. At step 550, information regarding the neighbors of $Q_2$ in the direction of $Q_1$ is analyzed in a similar fashion to determine coverage in that direction. If $Q_2$ lacks coverage in the direction of $Q_1$, $Q_2$'s coverage is updated and $Q_1$ is added as a neighbor at step 560. Again, if $Q_2$ has coverage in the direction of $Q_1$ or $Q_2$'s coverage has been updated, the process continues to step 570. At step 570, the process determines whether all component pairs have been analyzed. If component pairs remain to be analyzed, the process continues to step 580, at which the component pair having the shortest distance between them is selected from the remaining component pairs. Otherwise, the template preprocessing step is completed and the process continues to the simulated annealing routine.

The use of the neighborhood concept helps reduce the cost of computations for the template-to-layout mapping requirements. If n is the number of components to be positioned in the physical layout, the maximum number of possible computations would be of Order($n^2/2$). Using the neighborhood concept, the number of computations is reduced to Order($4*r*n$), where r is the radius of the neighborhood. So, for 50 components and using a radius of 2, the number of calculations for a method which examines all component pairs is $n^2/2=1250$, whereas only $4*r*n=400$ calculations must be performed using the method of the present invention. If the number of components is increased to 200, the number of calculations for a system examining all component pairs rises to $n^2/2=20,000$, while the method of the present invention requires only $4*r*n=1600$ calculations.

Figure 6:
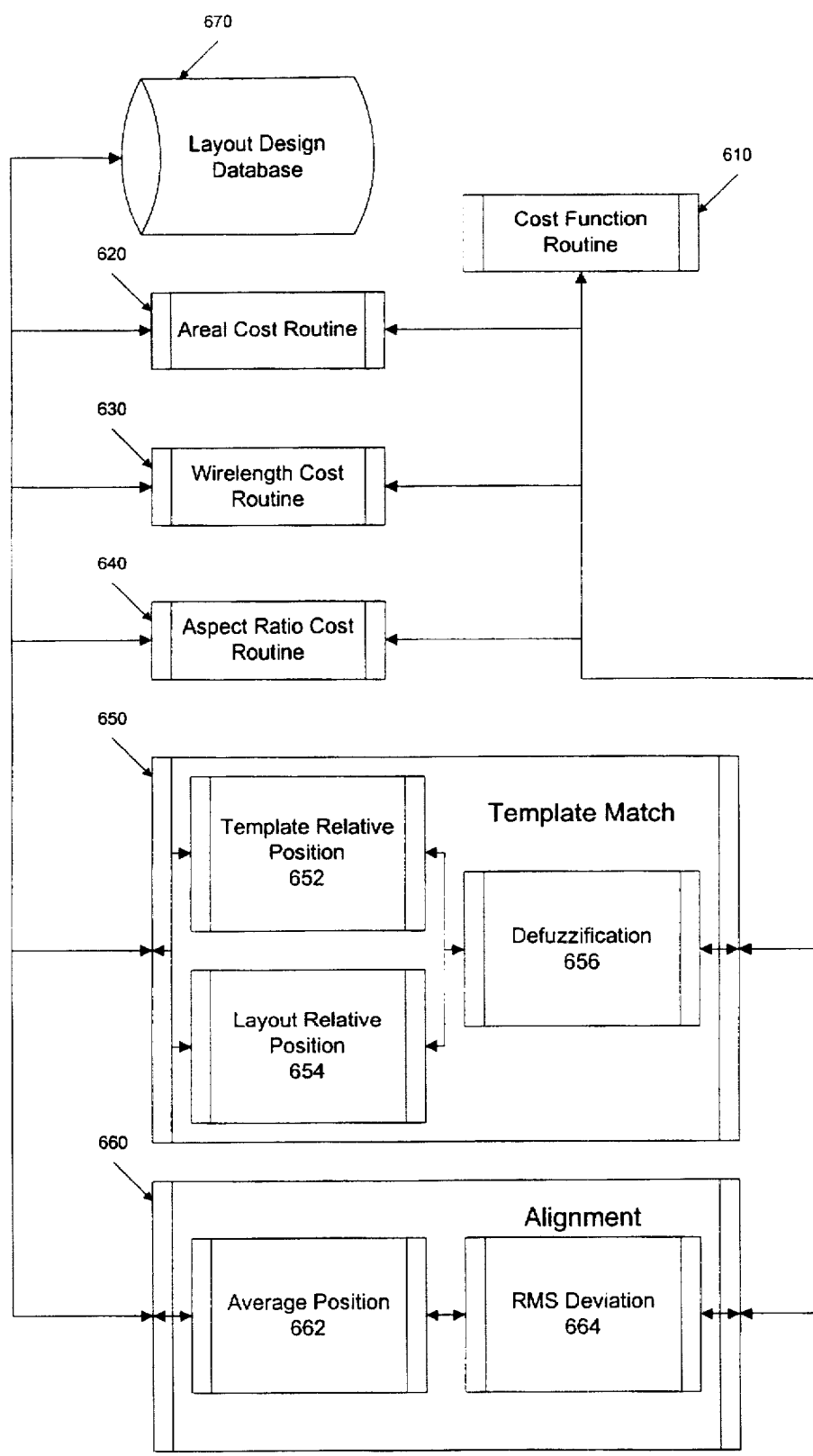
FIG. 6 is a block diagram of a cost function routine which embodies the method of the present invention.

FIG. 6 is a block diagram illustrating a cost function routine and its associated subroutines. Cost function routine 610 contains calls to various costing functions. The costing functions employed will depend upon the constraints which are deemed important by the designers. In the block diagram of FIG. 6, five costing function routines are illustrated. These routines are: an area cost routine 620, a wire length cost routine 630, an aspect ratio cost routine 640, a template matching routine 650 and an alignment routine 660. The first three costing routines are exemplary in nature and are presented merely for completeness. The overall cost function these modules represent may be written as:

$$C = \alpha_a C_a + \alpha_w C_w + \alpha_{AR} C_{AR} + \alpha_m C_m + \alpha_f C_f,$$

where, respectively:

$C_a$ and $\alpha_a$ are the placement area cost and its coefficient;
$C_w$ and $\alpha_w$ are the wiring length cost and its coefficient;
$C_{AR}$ and $\alpha_{AR}$ are the aspect ratio cost and its coefficient;
$C_m$ and $\alpha_m$ are the alignment cost and its coefficient; and
$C_f$ and $\alpha_f$ are the template-matching cost and its coefficient.

The coefficients presented above allow for the weighting of the outputs of the different costing functions. This permits one design criteria to be weighted more heavily than another, depending on the designer's objectives. Terms used in the cost function often scale linearly with the number of components. In order to maintain the balance of the cost function, the template matching cost may be normalized on a component-by-component basis by a division over the average number of neighbors for each component. The alignment cost is automatically normalized because this cost represents a set of RMS values, which are, by definition, normalized.

Each of the costing subroutines uses data from a layout design database 670. The data held in layout design database 670 includes information pertaining to the physical layout of the design, information regarding the design being converted into a physical layout and template information. The template information is used as one of the goals of the physical layout process. The physical layout is intended to approximate this template as closely as possible, given other constraints placed on the design's physical layout. Template matching subroutine 650 includes a template relative position routine 652, a layout relative position subroutine 654, and a defuzzification routine 656. Alignment routine 660 includes an average position subroutine 662 and an RMS deviation subroutine 664.

Figure 7:
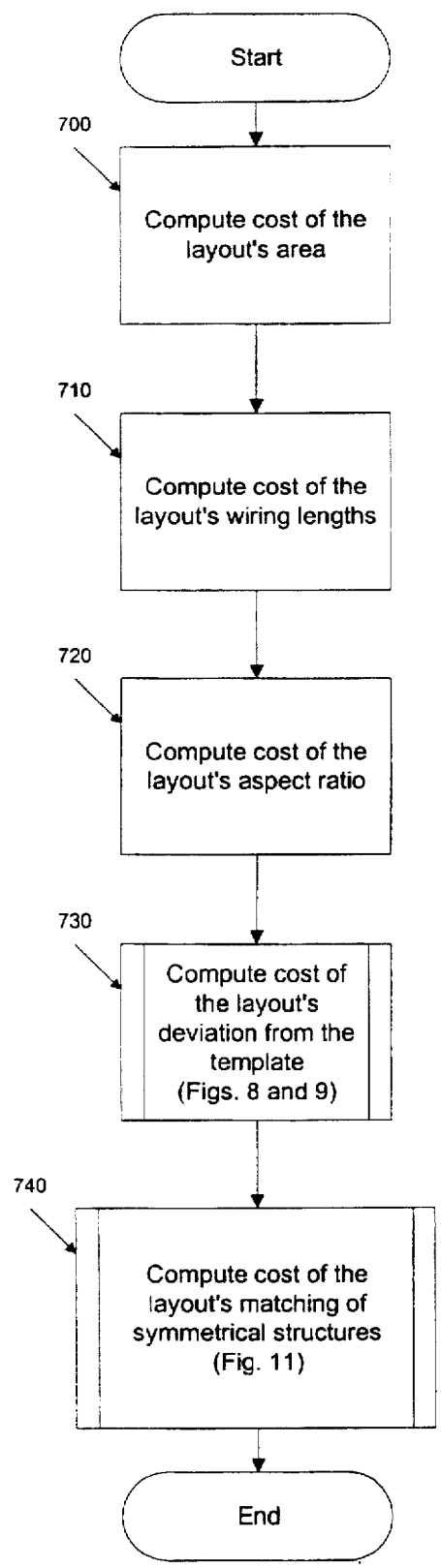
FIG. 7 is a flow diagram showing the costing step of FIG. 3 in greater detail.

A calling sequence of the various costing routines is illustrated in FIG. 7. The costing subroutines' actual order of execution is not a material aspect of the present invention, however. First, the cost of the layout's area is computed at step 700. At step 710, the cost of the layout's wiring lengths is computed. Next the cost of the layout's aspect ratio is computed at step 720. These first three steps are provided only as examples, to allow a better understanding of the framework in which the method of the present invention is intended to operate. Other costing functions may be used in addition to or in place of those illustrated, and one or more of the costing functions shown may be removed. At step 730, the cost of the layout's deviation from the template is computed. This analysis is further described in FIGS. 8 and 9, below. At step 740, the cost of the layout's matching of alignment requirements is then computed. This analysis is further explained in FIG. 11.

Figure 8:
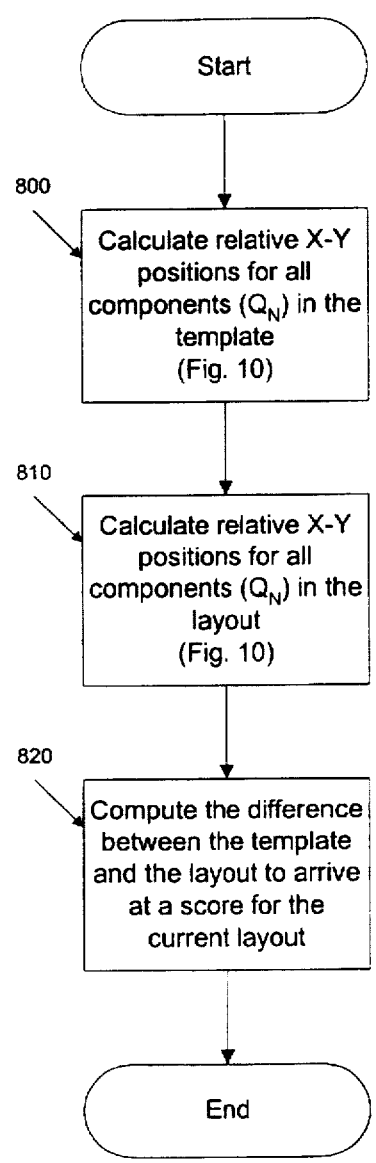
FIG. 8 is a flow diagram showing the basic steps of the portion of the method of the present invention analyzing the similarity of a physical layout to a template.

FIG. 8 illustrates a generalized explanation of template matching subroutine 650 (as shown in FIG. 6). The flow diagram in FIG. 8 delineates the fundamental steps performed in arriving at a cost for a given physical layout, with the goal of matching components' relative positions in the layout to those in the template. At step 800, the X-Y position of each component in the neighborhood of a given component ($Q_N$) in the template is computed relative to $Q_N$. These computations are performed for all $Q_N$ in the template and are further explained in FIG. 10. Similarly, at step 810, the X-Y position of each component in $Q_N$'s neighborhood in the physical layout is computed relative to $Q_N$. These computations are again performed for all $Q_N$ in the template and are also explained in FIG. 10. The components' relative positions in the template and physical layout allow the measurement of the physical layout's cost (i.e. deviation from the template). The method used to determine a component's relative X-Y position in the template may also be used to determine the component's relative X-Y position in the physical layout. At step 820, the difference between the relative positions of components in the template and the relative positions of components in the physical layout are computed to arrive at a score (i.e., cost) for the current layout.

The steps illustrated in FIG. 8 are best understood by example. For example, a layout might be desired for a schematic in which a second component ($Q_2$) is positioned to the right of and below a first component ($Q_1$). $Q_1$ is assumed to be fixed in position for purposes of this analysis. The relative position of $Q_2$ in the X and Y directions is determined by defining a function for each direction that reflects the relative position of $Q_2$ with respect to $Q_1$. For the X direction, the position of $Q_2$ relative to that of $Q_1$ is defined by the function $R_X(Q_1, Q_2, \text{template})$, such that the function is $-1$ if $Q_2$ is to the left of $Q_1$, and $+1$ if $Q_2$ is to the right of $Q_1$. If $Q_1$ and $Q_2$ overlap (either partially or fully), the function's value is between $-1$ and 1 (exclusive). In this manner, a physical layout can be scored, component pair by component pair. Similarly, the function $R_Y(Q_1, Q_2, \text{template})$ can be defined for the Y direction such that it is $-1$ when $Q_2$ is below $Q_1$, and $+1$ when $Q_2$ is above $Q_1$. The function's value can vary between $-1$ and $+1$ as $Q_2$ moves upwards with respect to $Q_1$.

Fuzzy functions are used to translate the R() values for the X and Y directions into fuzzy variables. The fuzzy variables representing a component's relative position may be defined using any number of elements. In a preferred embodiment, the values are translated into fuzzy variables consisting of triplets. Using the X direction with triplet fuzzy variables as an example, the function reflects the degree of confidence (i.e., fuzziness) with which it can be said that one device is to the left, right or overlaps the other device. When $Q_2$ is completely to the left of $Q_1$, $R_X(Q_1, Q_2, \text{template})$ has a value of $-1$, meaning that the fuzziness of $Q_2$ being to the left of $Q_1$ will be 1. In this case, the fuzziness of $Q_2$ overlapping and being to the right of $Q_1$ will be 0, yielding a fuzzy triplet of (1, 0, 0). If $Q_2$ completely overlaps $Q_1$ (or vice versa), $R_X(Q_1, Q_2, \text{template})$ has a value of 0 and the fuzziness that $Q_2$ overlaps $Q_1$ becomes 1. In this case, the fuzziness of $Q_2$ being to the right or left of $Q_1$ will be 0, yielding a fuzzy triplet of (0, 1, 0). Finally, if $Q_2$ is to the right of $Q_1$, $R_X(Q_1, Q_2, \text{template})$ has a value of 1 and the fuzziness that $Q_2$ is to the right of $Q_1$ becomes 1. In this case, the fuzziness of $Q_2$ overlapping or being to the left of $Q_1$ will be 0. In the example above, as in the last case, the fact that $Q_2$ is to the right of $Q_1$ can be translated into a fuzzy triple (0, 0, 1). Similar values are determined for the components' placements in the physical layout.

Figure 12:
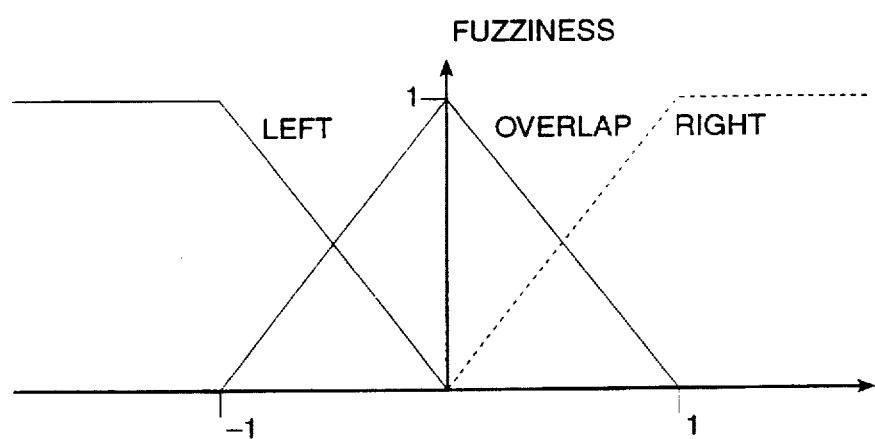
FIG. 12 is a graph showing the representation of a fuzzy triplet by a corresponding fuzzy graph according to the method of the present invention.

Intermediate values of $R_X()$ translate into varying values of triplets. As $Q_2$ moves from left to right with respect to $Q_1$, the fuzzy values of the triplet change to reflect $Q_2$'s position relative to $Q_1$. Each element of the fuzzy variable, in this case a fuzzy triplet may be represented by a corresponding fuzzy graph, as illustrated in FIG. 12. The combination of three fuzzy shapes covers the three possibilities represented by a fuzzy triplet. Thus, components which partially overlap will have non-zero values for two of the three elements. A similar set of shapes can be created for the Y direction, where the fuzzy triplet reflects the qualities of $Q_2$ being above, overlapping or being below $Q_1$.

A physical placement for the circuit is then generated. Ideally, the components' positions in the physical layout match their positions in the template. Some mismatch is likely to occur, however, due to architectural, performance and other design constraints. For example, $Q_2$ may be placed to the right and above with respect to $Q_1$ in this placement. The functions $R_X(Q_1, Q_2, \text{layout})$ and $R_Y(Q_1, Q_2, \text{layout})$ are then computed for this placement, returning values of $+1$ and $+1$, respectively. These values associated with the two design representations (template and physical layout) can then be input to a fuzzy evaluator, which returns a score between 0 (best) and 1 (worst). This may also be done for the Y direction. By repeating the process for all the selected device pairs, a good measure of the difference between the two design representations is obtained. The different scores are then summed to arrive at a template matching cost for the layout, which is then added to the layout's overall cost. A higher cost thus penalizes differences between the template and the layout.

The process used in the placer to compute the score requires the use of the output shape functions for the fuzzy evaluator. These functions reflect the goodness of the match between the template and layout. For example, three shape functions may be defined: one for the case of best match, another one for the case of good match and a last one for the case of worst match. A table is then created to map from the relative positions in both the template and the layout to a fuzzy goodness function in the output for the X direction. A similar table is generated for the Y direction, using "above" and "below" in place of "right" and "left," respectively.

The process of evaluating a score between 0 and 1 based on $R_X(Q_1, Q_2, \text{template})$ and $R_X(Q_1, Q_2, \text{layout})$ is called defuzzification. A similar evaluation is performed for pairs of $R_Y()$ values. Defuzzification relies on the output shapes and the map table to obtain a score. One such defuzzification method is known as the fuzzy-centroid method and is described in detail in "*Neural Networks and Fuzzy Systems,*" by Bart Kosko, Prentice Hall, 1992, the entirety of which is incorporated herein by reference.

In actuality, only one relative placement function (R()) need be used. Thus, $R_X(Q_1, Q_2, \text{template})$ is implemented as $R(X(Q_1 \text{ in the template}), X(Q_2 \text{ in the template}))$ and $RX(Q_1, Q_2, \text{layout})$ is implemented as $R(X(Q_1 \text{ in the layout}), X(Q_2 \text{ in the layout}))$. Similarly, $R_Y(Q_1, Q_2, \text{template})$ is implemented as $R(Y(Q_1 \text{ in the template}), Y(Q_2 \text{ in the template}))$ and $R_Y(Q_1, Q_2, \text{layout})$ is implemented as $R(Y(Q_1 \text{ in the layout}), Y(Q_2 \text{ in the layout}))$. The same defuzzifier (D()) is also used throughout the method of the present invention, once for the X direction and once for the Y direction.

Figure 9:
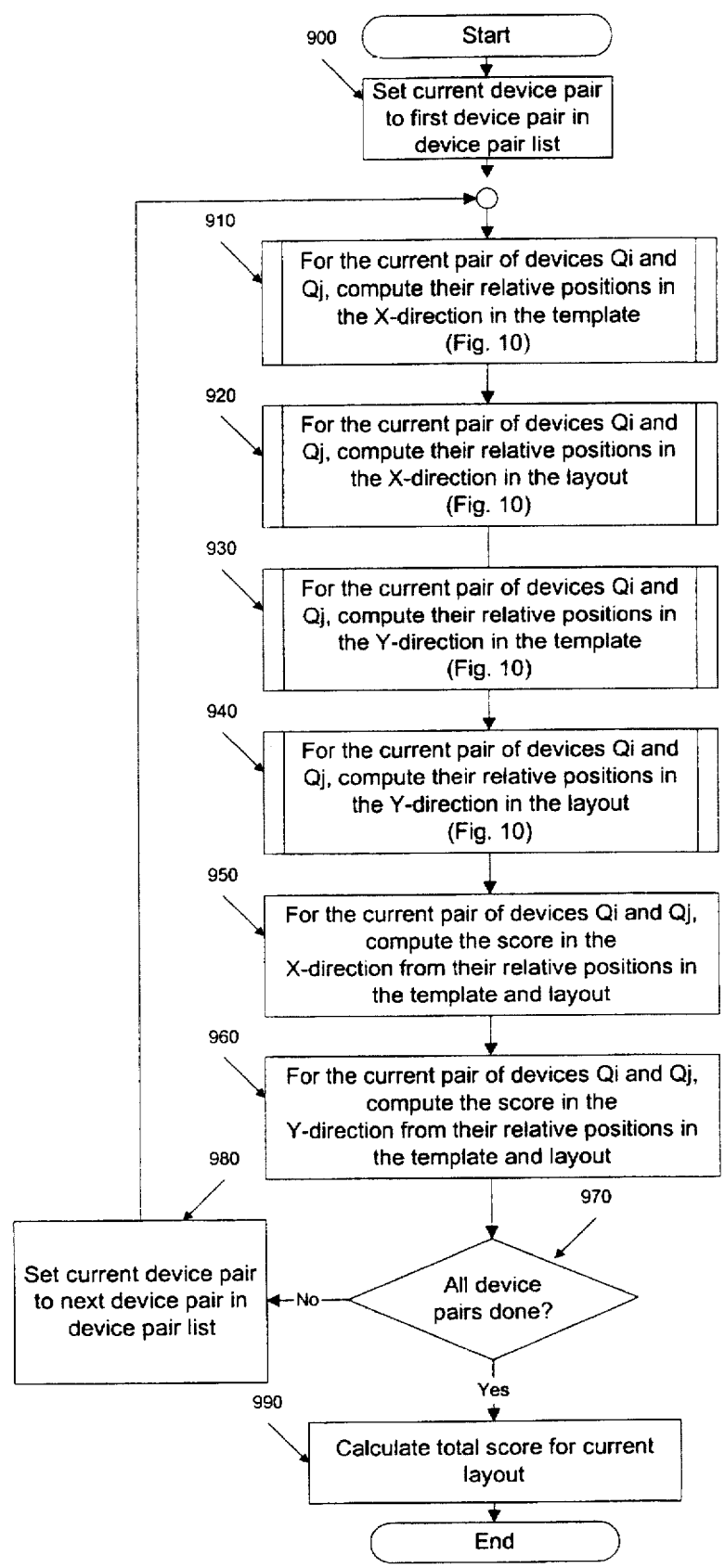
FIG. 9 is a flow diagram showing one embodiment of the method described in FIG. 8.

A more detailed flow diagram illustrating the steps performed in generating a score for a given physical layout with respect to a template is shown at FIG. 9. The score generated by the method illustrated in FIGS. 8 and 9 is equivalent to the cost of the physical layout in regard to matching the template which is indicated in FIGS. 3–7. The process illustrated in FIG. 9 begins at step 900 by setting the current device pair to the first device pair in the device pair list. At step 910, the relative position routine (illustrated in FIG. 10) is called to compute the positions of the current pair of devices relative to one another in the X direction in the template. At step 920, this same routine is executed to determine the positions of the current device pair relative to one another in the X direction in the layout. At step 930, the relative position routine is called to compute the relative positions of the device pair in the Y direction in the template. At step 940, the module is again called to compute the relative position of the current device pair in the Y direction in the layout. Next, a score (i.e., cost) is computed for the current device pair by first comparing the relative positions in the X direction in the template and physical layout (step 950). Because the relative positions are in the form of fuzzy variables, this may be done by a defuzzification process such as that mentioned earlier.

However, defuzzification takes an appreciable amount of time. This is because the computation of integrals is involved. The process' operation may be accelerated by generating a LUT as a pre-processing step. The LUT is a two-dimensional table that is indexed by the possible pairs of values by the R() function between −1 and 1 in small increments (e.g., 0.01 unit steps). The LUT stores the outputs from the D() function corresponding to these pairs. The values returned by the R() function are thus used as indexes to the proper D() output. The LUT generated at step 430 in FIG. 4 is thus used to reduce the computational load which would otherwise be encountered in performing defuzzification. Again, the LUT may be generated independently of this process, and referenced as a constant during operation.

At step 960, this process is repeated for the Y direction by comparing the device pair's relative positions in the template and physical layout. At step 970, it is determined whether all the device pairs have been processed. If device pairs remain to be processed, the current device pair is set to the next device pair in the device pair list at step 980. If all device pairs have been processed, the process continues to step 990, where a total score for the current layout is calculated by summing the differences calculated in steps 950 and 960.

Figure 10:
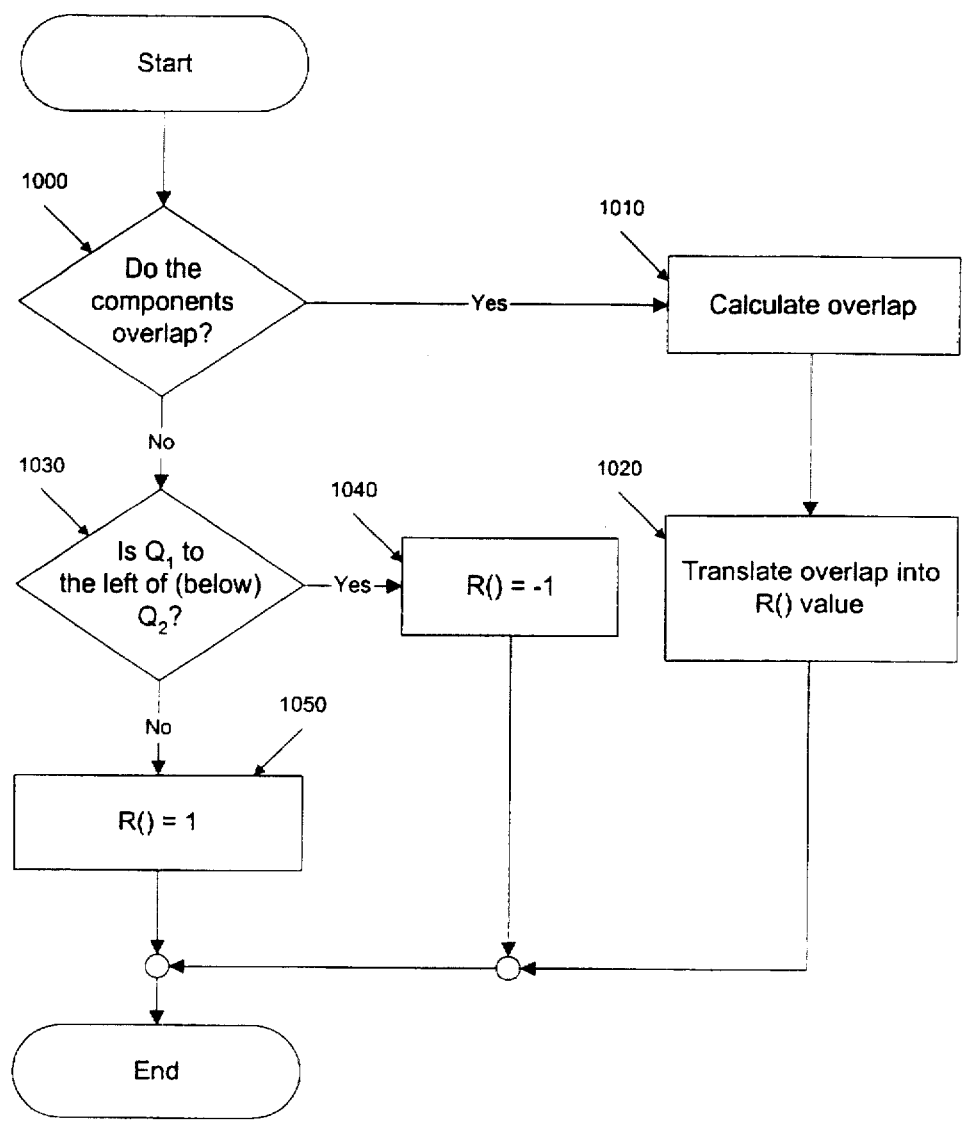
FIG. 10 is a flow diagram showing one embodiment of a portion of the method of the present invention which shows the relative position computation step in greater detail.

FIG. 10 illustrates an analysis which may be performed to determine the relative position of one component with respect to another component. This process begins at step 1000 by determining whether the two components in question overlap in the direction currently being analyzed. If the components being analyzed do overlap, the process proceeds to step 1010, where the amount that the two components overlap each other in the given direction is calculated. At step 1020, this overlap is translated into a relative position value in the range of −1 to 1 (exclusive). If the components do not overlap, the process proceeds to step 1030, where it is determined whether the first component is to the right of the second component. If this is the case, the process proceeds to step 1040 where the relative position value is set to −1. If the first component is not to the right of the second component (i.e., the first component is to the left of the second component), the relative position value is then assigned a value of 1 (step 1050). Likewise, if the components' relative positions are being analyzed in the Y direction, the decision at step 1030 will be analyzed in terms of whether the first component is below the second component. Again, if this is the case, a value of −1 will be returned at step 1040. If this is not the case (i.e., the first component is above the second component), a value of 1 will be returned at step 1050. If overlap exists, the relative position value will be assigned a value, as in steps 1010 and 1020.

Another concern of analog designers is ensuring that certain components are aligned along an axis parallel to, for example, the X or Y axis. This is based on so-called device alignment requirements. Alignment requirements may be added to the cost function of the exemplary simulated annealing program in the form of an RMS distance from the average X or Y position of the group of devices in question, thus forming an axis parallel to the X or Y axis. For example, four transistors, $Q_1$ $Q_2$ $Q_3$ and $Q_4$ might need to be aligned along an axis parallel to the Y axis due to design requirements. To achieve this goal, the RMS deviation from the transistors' average X value (i.e., the alignment cost) is iteratively reduced. The RMS deviation will go to zero and all four devices will have the same X position (i.e., they will be aligned along an axis parallel to the Y axis).

Figure 11:
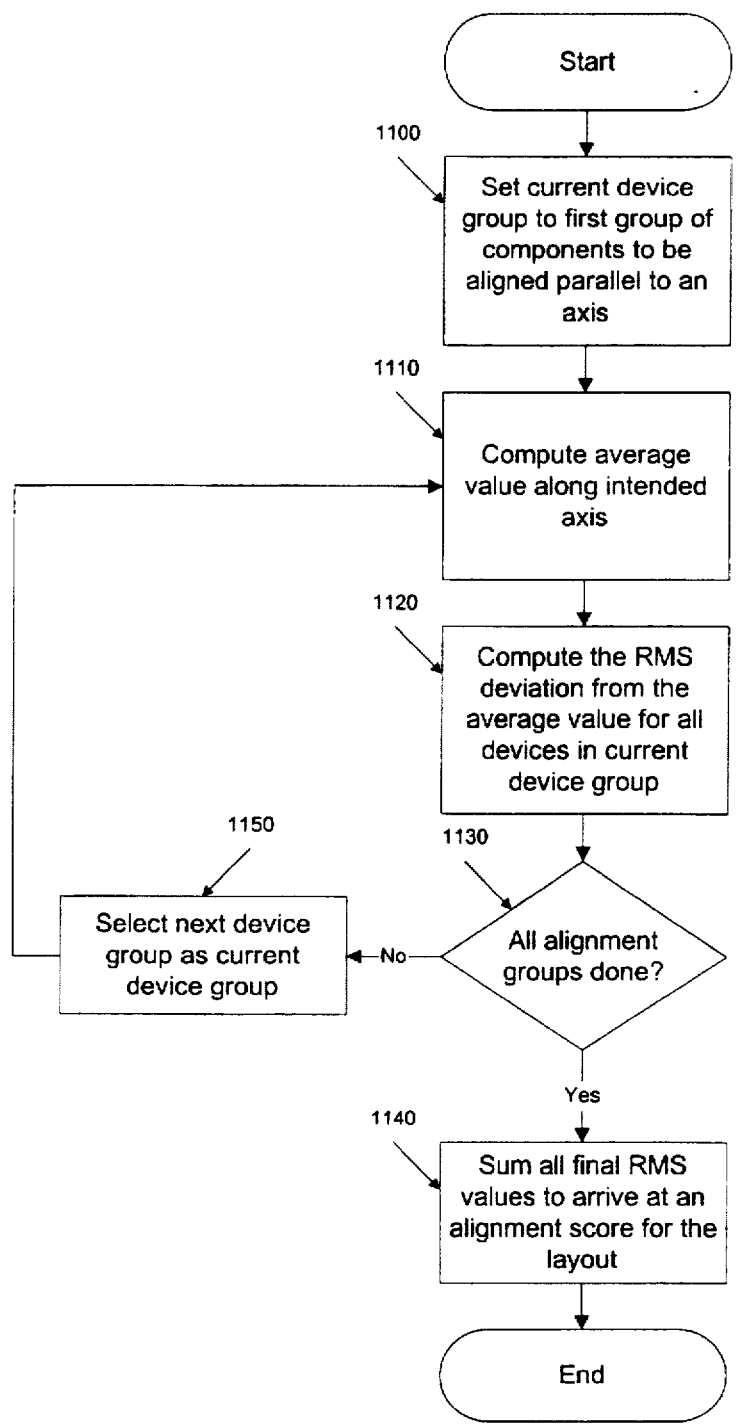
FIG. 11 is a flow diagram showing the basic steps of the portion of the method of the present invention analyzing component placement alignment.

In FIG. 11, the alignment routine (alignment routine 660 of FIG. 6 and step 740 of FIG. 7), which implements this costing function, is explained in more detail. The process begins at step 1100, where the current device group is set to the first group of components which are to be aligned along an axis. At step 1110, the average position of the group of components about the intended axis of placement is computed. The RMS deviation from this average value is also computed for all of the devices in the current device group (step 1120). At step 1130, it is determined whether device groups requiring alignment analysis remain. If device groups remain to be analyzed, the next device group is selected as the current device group (step 1150). If all device groups requiring such analysis have been so analyzed, the process proceeds to step 1140, where all final RMS values are summed to arrive at an alignment score for the current layout.

In the foregoing specification, the invention has been described with reference to specific exemplary embodiments thereof. It will, however, be evident that various modifications and changes may be made thereunto without departing from the broader spirit and scope of the invention as set forth in the appended claims.

Furthermore, the flow diagrams described herein are illustrative of merely the broad logical flow of steps to achieve a method of the present invention and that steps may be added to, or taken away from the flow diagrams without departing from the scope of the invention. Further, the order of execution of steps in the flow diagrams may be changed without departing from the scope of the invention. Additional considerations in implementing the method described by the flow diagrams may dictate changes in the selection and order of steps.

In general, the flow diagrams in this specification include one or more steps performed by software routines executed in a computer system. The routines may be implemented by any means as is known in the art. For example, any number of computer programming languages, such as Java, "C", Pascal, FORTRAN, assembly language, etc., may be used. Further, various programming approaches such as procedural, object oriented or artificial intelligence techniques may be employed.

Many such changes or modifications will be readily apparent to one of ordinary skill in the art. For example, although the described embodiments refer to operation in the context of a CAD workstation, the present invention will also find application in mainframe or personal computer systems. The specification and drawings are, accordingly, to be regarded in an illustrative rather than a restrictive sense, the invention being limited only by the provided claims and their full scope of equivalents.

What is claimed is:

1. A computer-implemented method for improving the similarity of the positioning of a plurality of circuit elements in a physical layout to the positioning of the plurality of circuit elements in a template, comprising the machine executed steps of:

(a) selecting a first circuit element from the plurality of circuit elements;

(b) selecting a second circuit element from the plurality of circuit elements;

(c) determining a first differential between a placement in the template of said first and said second circuit elements;

(d) determining a second differential between a placement in the physical layout of said first and said second circuit elements; and (e) comparing said first differential and said second differential to arrive at a placement cost for said placement of said second circuit element in said physical layout, wherein said comparing step comprises the machine executed steps of:

taking as input a first fuzzy variable, said fuzzy variable representing said first differential, and a second fuzzy variable, said second fuzzy variable representing said second differential;

combining said first and said second fuzzy variables to form a fuzzy output function; and analyzing said fuzzy output function to produce a score representing said placement cost.

2. The method of claim 1, further comprising machine executed steps of:

(f) repeating steps (b), (c), (d) and (e), where said second circuit element is selected from a set of selected other circuit elements; and (g) repeating steps (a), (b), (c), (d), (e) and (f), where said first circuit element is selected from a first subset of the plurality of circuit elements, each one of said first subset of the plurality of circuit elements having not been selected as said first circuit element.

3. The method of claim 2, wherein said set of selected other circuit elements define a neighborhood about said first circuit element.

4. The method of claim 1, further comprising the machine executed step of shifting the physical placement of the plurality of circuit elements to improve the similarity of the positioning of a plurality of circuit elements in a physical layout to the positioning of the plurality of circuit elements in a template.

5. The method of claim 4, wherein the step of shifting the plurality of circuit elements substantially preserves a relative positioning of the circuit elements.

6. The method of claim 4, wherein the step of shifting the plurality of circuit elements rearranges a relative positioning of the circuit elements.

7. A computer-implemented method for improving the similarity of the positioning of a plurality of circuit elements in a physical layout to the positioning of the plurality of circuit elements in a template, comprising the machine executed steps of:

(a) pre-processing the plurality of circuit elements in the template; and (b) evaluating a current placement of the plurality of circuit elements in the physical layout with regard to the positioning of the plurality of circuit elements in the template using a plurality of fuzzy functions to evaluate the similarity of the positioning of the plurality of circuit elements in the physical layout to the positioning of the plurality of circuit elements in the template to arrive at an overall placement cost for said current placement of the plurality of circuit elements in the physical layout.

8. The method of claim 7, wherein said pre-processing step comprises the machine executed step of:

generating a list of circuit element pairs, each one of said circuit element pairs comprising a first circuit element and a second circuit element.

9. The method of claim 8, wherein said pre-processing step further comprises the machine executed steps of:

(a) selecting a circuit element pair from said list of circuit element pairs;

(b) analyzing said circuit element pair to determine neighborhood information for said first and said second circuit elements of said circuit element pair; and (c) repeating steps (a) and (b) for all circuit element pairs in said list of circuit element pairs.

10. The method of claim 9, wherein said generating step comprises the machine executed steps of:

(a) selecting said first circuit element from the plurality of circuit elements;

(b) selecting said second circuit element from the plurality of circuit elements;

(c) calculating a distance between said first and said second circuit elements; and (d) using said distance to determine a position of said circuit element pair in said list of circuit element pairs.

11. The method of claim 9, wherein said analyzing step comprises the machine executed steps of:

(a) aborting said analyzing step if a set of neighboring circuit elements is completely defined for each of said first and said second circuit elements;

(b) determining if said second circuit element is a neighbor of said first circuit element using the positioning of said second circuit element; and (c) determining if said first circuit element is a neighbor of said second circuit element using the positioning of said first circuit element.

12. The method of claim 11, wherein each of said determining steps comprises the machine executed steps of:

(a) selecting a direction to analyze from a set of possible directions;

(b) evaluating coverage in said direction, and if said direction lacks coverage,
updating neighborhood information, and
updating coverage information;

(c) selecting said direction to analyze from those directions in said set of possible directions which have not yet been selected; and (d) repeating steps (b) and (c) for all directions in said set of possible directions.

13. The method of claim 12, wherein said pre-processing step further comprises the machine executed step of:

(e) generating a lookup table by defuzzifying said plurality of fuzzy functions.

14. The method of claim 8, wherein said evaluating step comprises the machine executed steps of:

(a) selecting a first circuit element from the plurality of circuit elements;

(b) selecting a second circuit element from a first set of circuit elements, said first set of circuit element being those circuit elements in a neighborhood of said first circuit element;

(c) determining a first differential between a placement in the template of said first and said second circuit elements of said selected circuit element pair;

(d) determining a second differential between a placement in the physical layout of said first and said second circuit elements from said selected circuit element pair;

(e) comparing said first differential and said second differential to arrive at a placement cost for said placement of said second circuit element in said physical layout;

(f) repeating steps (b), (c), (d) and (e), where said second circuit element is selected from a second set of circuit elements, said second set of circuit elements comprising those circuit elements in said first set of circuit elements which have not yet been selected as said second circuit element; and (g) repeating steps (a), (b), (c), (d), (e) and (f), where said first circuit element is selected from a first subset of the plurality of circuit elements, each one of said first subset of the plurality of circuit elements having not been selected as said first circuit element.

15. The method of claim 14, wherein each of said determining steps comprises the machine executed steps of:

(a) determining said first differential along a first axis; and (b) determining said first differential along a second axis, said second axis being perpendicular to said first axis.

16. The method of claim 15, wherein step (a) comprises the machine executed step of determining whether a positioning of said first circuit element overlaps a positioning of said second circuit element in a direction parallel to said first axis, and if said positioning of said first circuit element overlaps said positioning of said second circuit element in said direction,
calculating an overlap value and
setting an output value to said overlap value, and if said positioning of said first circuit element does not overlap said positioning of said second circuit element in said direction,
determining whether said positioning of said second circuit element is at a first extreme in said direction, and
if said positioning of said second circuit element is positioned at a first extreme in said direction, setting said output value to a first extreme value, and
if said positioning of said second circuit element is positioned at a second extreme in said direction, setting said output value to a second extreme value.

17. The method of claim 15, wherein step (b) comprises the machine executed step of determining whether a positioning of said first circuit element overlaps a positioning of said second circuit element in a direction parallel to said second axis, and if said positioning of said first circuit element overlaps said positioning of said second circuit element in said direction,
calculating an overlap value and
setting an output value to said overlap value, and if said positioning of said first circuit element does not overlap said positioning of said second circuit element in said direction,
determining whether said positioning of said second circuit element is at a first extreme in said direction, and
if said positioning of said second circuit element is positioned at a first extreme in said direction, setting said output value to a first extreme value, and
if said positioning of said second circuit element is positioned at a second extreme in said direction, setting said output value to a second extreme value.

18. The method of claim 15, wherein each of steps (a) and (b) comprises the machine executed steps of:

(a) selecting a set from a plurality of sets, the degree of membership in said set indicating the degree to which said second circuit element can be said to be in a given position relative to said first circuit element;

(b) determining a membership of said second circuit element in said set; and (c) repeating steps (a) and (b) for selected sets in said plurality of sets.

19. The method of claim 18, wherein said sets are fuzzy variable sets and said determining step produces a fuzzy variable.

20. The method of claim 19, wherein said comparing step comprises the machine executed steps of:

taking as input a first fuzzy variable, said fuzzy variable representing said first differential, and a second fuzzy variable, said second fuzzy variable representing said second differential;

combining said first and said second fuzzy variables to form a fuzzy output function; and analyzing said fuzzy output function to produce a score for a placement of said second circuit element relative to said first circuit element.

21. The method of claim 14, wherein said comparing step comprises the machine executed step of selecting a placement cost for said selected circuit element pair from a lookup table containing a plurality of placement costs using said first and second differentials as indexes into said lookup table.

22. The method of claim 7, wherein said computer-implemented method further comprises the machine executed step of:

generating a lookup table by defuzzifying said plurality of fuzzy functions prior to said pre-processing step.

23. A computer system comprising:

an electronic storage system for storing physical layout data and template data;

an electronic storage system for accessing said physical layout data and said template data; and a processing system that is configured to improve the similarity of the positioning of a plurality of circuit elements in a physical layout to the positioning of the plurality of circuit elements in a template, by virtue of being configured to:

(a) select a first circuit element from the plurality of circuit elements;

(b) select a second circuit element from the plurality of circuit elements;

(c) determine a first differential between a placement in the template of said first and said second circuit elements;

(d) determine a second differential between a placement in the physical layout of said first and said second circuit elements; and (e) compare said first differential and said second differential to arrive at a placement cost for said placement of said second circuit element in said physical layout, wherein said processing system is configured to compare said first differential and said second differential by virtue of being further configured to:

take as input a first fuzzy variable, said fuzzy variable representing said first differential, and a second fuzzy variable, said second fuzzy variable representing said second differential;

combine said first and said second fuzzy variables to form a fuzzy output function; and analyze said fuzzy output function to produce a score representing said placement cost.

24. The computer system of claim 23, wherein said processing system is configured to improve the similarity of the positioning of a plurality of circuit elements in a physical layout to the positioning of the plurality of circuit elements in a template, by virtue of being further configured to:

(f) repeat code marked (b), (c), (d) and (e), where said second circuit element is selected from a set of selected other circuit elements; and (g) repeat code marked (a), (b), (c), (d), (e) and (f), where said first circuit element is selected from a first subset of the plurality of circuit elements, each one of said first subset of the plurality of circuit elements having not been selected as said first circuit element.

25. A computer system comprising:

an electronic storage system for storing physical layout data and template data;

an electronic storage system for accessing said physical layout data and said template data; and a processing system that is configured to improve the similarity of the positioning of a plurality of circuit elements in a physical layout to the positioning of the plurality of circuit elements in a template, by virtue of being configured to:

(a) pre-process the plurality of circuit elements in the template; and (b) evaluate a current placement of the plurality of circuit elements in the physical layout with regard to the positioning of the plurality of circuit elements in the template using a plurality of fuzzy functions to evaluate the similarity of the positioning of the plurality of circuit elements in the physical layout to the positioning of the plurality of circuit elements in the template to arrive at an overall placement cost for said current placement of the plurality of circuit elements in the physical layout.

26. The computer system of claim 25, wherein said processing system is configured to pre-process the plurality of circuit elements in the template by virtue of being further configured to:

(a) generate a list of circuit element pairs, each one of said circuit element pairs comprising a first circuit element and a second circuit element;

(b) select a circuit element pair from said list of circuit element pairs;

(c) analyze said circuit element pair to determine neighborhood information for said first and said second circuit elements of said circuit element pair; and (f) repeat steps (b) and (c) for all circuit element pairs in said list of circuit element pairs.

27. The computer system of claim 26, wherein said processing system is configured to evaluate said current placement of the plurality of circuit elements in the physical layout with regard to the positioning of the plurality of circuit elements in the template, by virtue of being further configured to:

(a) select a first circuit element from the plurality of circuit elements;

(b) select a second circuit element from a first set of circuit elements, said first set of circuit element being those circuit elements in a neighborhood of said first circuit element;

(c) determine a first differential between a placement in the template of said first and said second circuit elements of said selected circuit element pair;

(d) determine a second differential between a placement in the physical layout of said first and said second circuit elements from said selected circuit element pair;

(e) compare said first differential and said second differential to arrive at a placement cost for said placement of said second circuit element in said physical layout;

(f) repeat steps (b), (c), (d) and (e), where said second circuit element is selected from a second set of circuit elements, said second set of circuit elements comprising those circuit elements in said first set of circuit elements which have not yet been selected as said second circuit element; and (g) repeat steps (a), (b), (c), (d), (e) and (f), where said first circuit element is selected from a first subset of the plurality of circuit elements, each one of said first subset of the plurality of circuit elements having not been selected as said first circuit element.

28. The computer system of claim 27, wherein said processing system is configured to determine said first differential, by virtue of being further configured to:

(a) select a fuzzy set from a plurality of fuzzy sets, the degree of membership in said set indicating the degree to which said second circuit element can be said to be in a given position relative to said first circuit element;

(b) determine a membership of said second circuit element in said fuzzy set to produce a fuzzy variable; and (c) repeat steps (a) and (b) for selected sets in said plurality of fuzzy sets.

29. The computer system of claim 27, wherein said processing system is configured to compare said first differential and said second differential, by virtue of being further configured to:

take as input a first fuzzy variable, said fuzzy variable representing said first differential, and a second fuzzy variable, said second fuzzy variable representing said second differential;

combine said first and said second fuzzy variables to form a fuzzy output function; and analyze said fuzzy output function to produce a score for a placement of said second circuit element relative to said first circuit element.

30. A computer program product for generating a physical layout of circuit elements, comprising:

a computer readable storage medium storing a computer program, the computer program comprising:

(a) code that selects a first circuit element from the plurality of circuit elements;

(b) code that selects a second circuit element from the plurality of circuit elements;

(c) code that determines a first differential between a placement in the template of said first and said second circuit elements;

(d) code that determines a second differential between a placement in the physical layout of said first and said second circuit elements; and (e) code that compares said first differential and said second differential to arrive at a placement cost for said placement of said second circuit element in said physical layout, wherein said code that compares said first differential and said second differential comprises:

code that takes as input a first fuzzy variable, said fuzzy variable representing said first differential, and a second fuzzy variable, said second fuzzy variable representing said second differential;

code that combines said first and said second fuzzy variables to form a fuzzy output function; and code that analyzes said fuzzy output function to produce a score representing said placement cost.

31. The computer program product of claim 30, wherein said code that requests information about said data file further comprises:

(f) code that repeats code marked (b), (c), (d) and (e), where said second circuit element is selected from a set of selected other circuit elements; and (g) code that repeats code marked (a), (b), (c), (d), (e) and (f), where said first circuit element is selected from a first subset of the plurality of circuit elements, each one of said first subset of the plurality of circuit elements having not been selected as said first circuit element.

32. A computer program product for generating a physical layout of circuit elements, comprising:

a computer readable storage medium storing a computer program, the computer program comprising:

code that pre-processes the plurality of circuit elements in the template; and code that evaluates a current placement of the plurality of circuit elements in the physical layout with regard to the positioning of the plurality of circuit elements in the template using a plurality of fuzzy functions to evaluate the similarity of the positioning of the plurality of circuit elements in the physical layout to the positioning of the plurality of circuit elements in the template to arrive at an overall placement cost for said current placement of the plurality of circuit elements in the physical layout.

33. The computer program product of claim 32, wherein said code that pre-processes the plurality of circuit elements in the template further comprises:

(a) code that generates a list of circuit element pairs, each one of said circuit element pairs comprising a first circuit element and a second circuit element;

(b) code that selects a circuit element pair from said list of circuit element pairs;

(c) code that analyzes said circuit element pair to determine neighborhood information for said first and said second circuit elements of said circuit element pair; and (f) code that repeats code marked (b) and (c) for all circuit element pairs in said list of circuit element pairs.

34. The computer program product of claim 33, wherein said code that evaluates said current placement of the plurality of circuit elements in the physical layout with regard to the positioning of the plurality of circuit elements in the template further comprises:

(a) code that selects a first circuit element from the plurality of circuit elements;

(b) code that selects a second circuit element from a first set of circuit elements, said first set of circuit element being those circuit elements in a neighborhood of said first circuit element;

(c) code that determines a first differential between a placement in the template of said first and said second circuit elements of said selected circuit element pair;

(d) code that determines a second differential between a placement in the physical layout of said first and said second circuit elements from said selected circuit element pair;

(e) code that compares said first differential and said second differential to arrive at a placement cost for said placement of said second circuit element in said physical layout;

(f) code that repeats code marked (b), (c), (d) and (e), where said second circuit element is selected from a second set of circuit elements, said second set of circuit elements comprising those circuit elements in said first set of circuit elements which have not yet been selected as said second circuit element; and (g) code that repeats code marked (a), (b), (c), (d), (e) and (f), where said first circuit element is selected from a first subset of the plurality of circuit elements, each one of said first subset of the plurality of circuit elements having not been selected as said first circuit element.

35. The computer program product of claim 34, wherein said code that determines said first differential further comprises:

(a) code that selects a fuzzy set from a plurality of fuzzy sets, the degree of membership in said set indicating the degree to which said second circuit element is in a given position relative to said first circuit element;

(b) code that determines a membership of said second circuit element in said fuzzy set to produce a fuzzy variable; and (c) code that repeats code marked (a) and (b) for selected sets in said plurality of fuzzy sets.

36. The computer program product of claim 34, wherein said code that compares said first differential and said second differential further comprises:

code that takes as input a first fuzzy variable, said fuzzy variable representing said first differential, and a second fuzzy variable, said second fuzzy variable representing said second differential;

code that combines said first and said second fuzzy variables to form a fuzzy output function; and code that analyzes said fuzzy output function to produce a score for a placement of said second circuit element relative to said first circuit element.

37. A computer-implemented method for improving the similarity of the positioning of a plurality of circuit elements in a physical layout to the positioning of the plurality of circuit elements in a template, comprising the machine executed steps of:

(a) pre-processing the plurality of circuit elements in the template, wherein said pre-processing step comprises the machine executed steps of:

(i) generating a list of circuit element pairs, each one of said circuit element pairs comprising a first circuit element and a second circuit element, (ii) selecting a circuit element pair from said list of circuit element pairs, (iii) analyzing said circuit element pair to determine neighborhood information for said first and said second circuit elements of said circuit element pair, said analyzing step comprising the steps of:

aborting said analyzing step if a set of neighboring circuit elements is completely defined for each of said first and said second circuit elements, determining if said second circuit element is a neighbor of said first circuit element using the positioning of said second circuit element, and determining if said first circuit element is a neighbor of said second circuit element using the positioning of said first circuit element, and (iv) repeating said steps (ii) and (iii) for at least some circuit element pairs in said list of circuit element pairs; and (b) evaluating a current placement of the plurality of circuit elements in the physical layout with regard to the positioning of the plurality of circuit elements in the template to arrive at an overall placement cost for said current placement of the plurality of circuit elements in the physical layout.

38. The method of claim 37, wherein each of said determining steps comprises the machine executed steps of:
(a) selecting a direction to analyze from a set of possible directions;
(b) evaluating coverage in said direction, and if said direction lacks coverage,
   updating neighborhood information, and
   updating coverage information;
(c) selecting said direction to analyze from those directions in said set of possible directions which have not yet been selected; and
(d) repeating steps (b) and (c) for at least some directions in said set of possible directions.

39. The method of claim 38, wherein said pre-processing step further comprises the machine executed step of:
(e) generating a lookup table by defuzzifying a plurality of fuzzy functions, said fuzzy functions used to evaluate the similarity of the positioning of the plurality of circuit elements in the physical layout to the positioning of the plurality of circuit elements in the template.

40. A computer-implemented method for improving the similarity of the positioning of a plurality of circuit elements in a physical layout to the positioning of the plurality of circuit elements in a template, comprising the machine executed steps of:
pre-processing the plurality of circuit elements in the template, wherein said pre-processing step comprises the machine executed step of:
generating a list of circuit element pairs, each one of said circuit element pairs comprising a first circuit element and a second circuit element; and
evaluating a current placement of the plurality of circuit elements in the physical layout with regard to the positioning of the plurality of circuit elements in the template to arrive at an overall placement cost for said current placement of the plurality of circuit elements in the physical layout, wherein said evaluating step comprises the machine executed steps of:
(a) selecting a first circuit element from the plurality of circuit elements,
(b) selecting a second circuit element from a first set of circuit elements, said first set of circuit element being those circuit elements in a neighborhood of said first circuit element,
(c) determining a first differential between a placement in the template of said first and said second circuit elements of said selected circuit element pair, wherein said step of determining a first differential comprises the machine executed step of:
determining whether a positioning of said first circuit element overlaps a positioning of said second circuit element in a direction parallel to said first axis, and
if said positioning of said first circuit element overlaps said positioning of said second circuit element in said direction,
calculating an overlap value and setting an output value to said overlap value, and
if said positioning of said first circuit element does not overlap said positioning of said second circuit element in said direction,
determining whether said positioning of said second circuit element is at a first extreme in said direction, and if said positioning of said second circuit element is positioned at a first extreme in said direction, setting said output value to a first extreme value, and
if said positioning of said second circuit element is positioned at a second extreme in said direction, setting said output value to a second extreme value;
(d) determining a second differential between a placement in the physical layout of said first and said second circuit elements from said selected circuit element pair,
(e) comparing said first differential and said second differential to arrive at a placement cost for said placement of said second circuit element in said physical layout,
(f) repeating steps (b), (c), (d) and (e), where said second circuit element is selected from a second set of circuit elements, said second set of circuit elements comprising those circuit elements in said first set of circuit elements which have not yet been selected as said second circuit element, and
(g) repeating steps (a), (b), (c), (d), (e) and (f), where said first circuit element is selected from a first subset of the plurality of circuit elements, each one of said first subset of the plurality of circuit elements having not been selected as said first circuit element.

41. A computer-implemented method for improving the similarity of the positioning of a plurality of circuit elements in a physical layout to the positioning of the plurality of circuit elements in a template, comprising the machine executed steps of:
pre-processing the plurality of circuit elements in the template, wherein said pre-processing step comprises the machine executed step of:
generating a list of circuit element pairs, each one of said circuit element pairs comprising a first circuit element and a second circuit element; and
evaluating a current placement of the plurality of circuit elements in the physical layout with regard to the positioning of the plurality of circuit elements in the template to arrive at an overall placement cost for said current placement of the plurality of circuit elements in the physical layout, wherein said evaluating step comprises the machine executed steps of:
(a) selecting a first circuit element from the plurality of circuit elements,
(b) selecting a second circuit element from a first set of circuit elements, said first set of circuit element being those circuit elements in a neighborhood of said first circuit element,
(c) determining a first differential between a placement in the template of said first and said second circuit elements of said selected circuit element pair,
(d) determining a second differential between a placement in the physical layout of said first and said second circuit elements from said selected circuit element pair, wherein said step of determining a second differential comprises the machine executed step of:
determining whether a positioning of said first circuit element overlaps a positioning of said second circuit element in a direction parallel to said second axis, and
if said positioning of said first circuit element overlaps said positioning of said second circuit element in said direction, calculating an overlap value and setting an output value to said overlap value, and if said positioning of said first circuit element does not overlap said positioning of said second circuit element in said direction, determining whether said positioning of said second circuit element is at a first extreme in said direction, and if said positioning of said second circuit element is positioned at a first extreme in said direction, setting said output value to a first extreme value, and if said positioning of said second circuit element is positioned at a second extreme in said direction, setting said output value to a second extreme value, (e) comparing said first differential and said second differential to arrive at a placement cost for said placement of said second circuit element in said physical layout, (f) repeating steps (b), (c), (d) and (e), where said second circuit element is selected from a second set of circuit elements, said second set of circuit elements comprising those circuit elements in said first set of circuit elements which have not yet been selected as said second circuit element, and (g) repeating steps (a), (b), (c), (d), (e) and (f), where said first circuit element is selected from a first subset of the plurality of circuit elements, each one of said first subset of the plurality of circuit elements having not been selected as said first circuit element.

42. A computer-implemented method for improving the similarity of the positioning of a plurality of circuit elements in a physical layout to the positioning of the plurality of circuit elements in a template, comprising the machine executed steps of:

pre-processing the plurality of circuit elements in the template, wherein said pre-processing step comprises the machine executed step of:

generating a list of circuit element pairs, each one of said circuit element pairs comprising a first circuit element and a second circuit element; and evaluating a current placement of the plurality of circuit elements in the physical layout with regard to the positioning of the plurality of circuit elements in the template to arrive at an overall placement cost for said current placement of the plurality of circuit elements in the physical layout, wherein said evaluating step comprises the machine executed steps of:

(a) selecting a first circuit element from the plurality of circuit elements, (b) selecting a second circuit element from a first set of circuit elements, said first set of circuit element being those circuit elements in a neighborhood of said first circuit element, (c) determining a first differential between a placement in the template of said first and said second circuit elements of said selected circuit element pair, wherein said step of determining a first differential comprises the machine executed steps of:

(i) selecting a first set from a first plurality of sets, the degree of membership in said first set indicating the degree to which said second circuit element can be said to be in a first given position relative to said first circuit element, (ii) determining a first membership of said second circuit element in said first set, and (iii) repeating steps (i) and (ii) for selected sets in said first plurality of sets, (d) determining a second differential between a placement in the physical layout of said first and said second circuit elements from said selected circuit element pair, wherein said step of determining a second differential comprises the machine executed steps of:

(i) selecting a second set from a second plurality of sets, the degree of membership in said second set indicating the degree to which said second circuit element can be said to be in a second given position relative to said first circuit element, (ii) determining a second membership of said second circuit element in said second set, and (iii) repeating steps (i) and (ii) for selected sets in said second plurality of sets, (e) comparing said first differential and said second differential to arrive at a placement cost for said placement of said second circuit element in said physical layout, (f) repeating steps (b), (c), (d) and (e), where said second circuit element is selected from a second set of circuit elements, said second set of circuit elements comprising those circuit elements in said first set of circuit elements which have not yet been selected as said second circuit element, and (g) repeating steps (a), (b), (c), (d), (e) and (f), where said first circuit element is selected from a first subset of the plurality of circuit elements, each one of said first subset of the plurality of circuit elements having not been selected as said first circuit element.

43. The method of claim 42, wherein said first and second sets are fuzzy variable sets and each one of said determining steps produces fuzzy variables.

44. The method of claim 43, wherein said comparing step comprises the machine executed steps of:

taking as input a first fuzzy variable, said fuzzy variable representing said first differential, and a second fuzzy variable, said second fuzzy variable representing said second differential;

combining said first and said second fuzzy variables to form a fuzzy output function; and analyzing said fuzzy output function to produce a score for a placement of said second circuit element relative to said first circuit element.

45. A computer system comprising:

an electronic storage system for storing physical layout data and template data;

an electronic storage system for accessing said physical layout data and said template data;

a processing system that is configured to improve the similarity of the positioning of a plurality of circuit elements in a physical layout to the positioning of the plurality of circuit elements in a template, by virtue of being configured to:

(a) pre-process the plurality of circuit elements in the template, wherein said processing system is configured to pre-process the plurality of circuit elements in the template by virtue of being further configured to:

(i) generate a list of circuit element pairs, each one of said circuit element pairs comprising a first circuit element and a second circuit element, (ii) select a circuit element pair from said list of circuit element pairs, (iii) analyze said circuit element pair to determine neighborhood information for said first and said second circuit elements of said circuit element pair, and (iv) repeat steps (ii) and (iii) for at least some circuit element pairs in said list of circuit element pairs, (b) evaluate a current placement of the plurality of circuit elements in the physical layout with regard to the positioning of the plurality of circuit elements in the template to arrive at an overall placement cost for said current placement of the plurality of circuit elements in the physical layout, wherein said processing system is configured to evaluate said current placement of the plurality of circuit elements in the physical layout with regard to the positioning of the plurality of circuit elements in the template, by virtue of being further configured to:

(i) select a first circuit element from the plurality of circuit elements, (ii) select a second circuit element from a first set of circuit elements, said first set of circuit element being those circuit elements in a neighborhood of said first circuit element, (iii) determine a first differential between a placement in the template of said first and said second circuit elements of said selected circuit element pair, wherein said processing system is configured to determine said first differential, by virtue of being further configured to:

(I) select a fuzzy set from a plurality of fuzzy sets, the degree of membership in said set indicating the degree to which said second circuit element can be said to be in a given position relative to said first circuit element, (II) determine a membership of said second circuit element in said fuzzy set to produce a fuzzy variable, and (III) repeat steps (I) and (II) for selected sets in said plurality of fuzzy sets, (iv) determine a second differential between a placement in the physical layout of said first and said second circuit elements from said selected circuit element pair, (v) compare said first differential and said second differential to arrive at a placement cost for said placement of said second circuit element in said physical layout, (vi) repeat steps (ii), (iii), (iv) and (v), where said second circuit element is selected from a second set of circuit elements, said second set of circuit elements comprising those circuit elements in said first set of circuit elements which have not yet been selected as said second circuit element, and (vii) repeat steps (i), (ii), (iii), (iv), (v) and (vi), where said first circuit element is selected from a first subset of the plurality of circuit elements, each one of said first subset of the plurality of circuit elements having not been selected as said first circuit element.

46. A computer system comprising:

an electronic storage system for storing physical layout data and template data;

an electronic storage system for accessing said physical layout data and said template data;

a processing system that is configured to improve the similarity of the positioning of a plurality of circuit elements in a physical layout to the positioning of the plurality of circuit elements in a template, by virtue of being configured to:

(a) pre-process the plurality of circuit elements in the template, wherein said processing system is configured to pre-process the plurality of circuit elements in the template by virtue of being further configured to:

(i) generate a list of circuit element pairs, each one of said circuit element pairs comprising a first circuit element and a second circuit element, (ii) select a circuit element pair from said list of circuit element pairs, (iii) analyze said circuit element pair to determine neighborhood information for said first and said second circuit elements of said circuit element pair, and (iv) repeat steps (ii) and (iii) for at least some circuit element pairs in said list of circuit element pairs, (b) evaluate a current placement of the plurality of circuit elements in the physical layout with regard to the positioning of the plurality of circuit elements in the template to arrive at an overall placement cost for said current placement of the plurality of circuit elements in the physical layout, wherein said processing system is configured to evaluate said current placement of the plurality of circuit elements in the physical layout with regard to the positioning of the plurality of circuit elements in the template, by virtue of being further configured to:

(i) select a first circuit element from the plurality of circuit elements, (ii) select a second circuit element from a first set of circuit elements, said first set of circuit element being those circuit elements in a neighborhood of said first circuit element, (iii) determine a first differential between a placement in the template of said first and said second circuit elements of said selected circuit element pair, (iv) determine a second differential between a placement in the physical layout of said first and said second circuit elements from said selected circuit element pair, (v) compare said first differential and said second differential to arrive at a placement cost for said placement of said second circuit element in said physical layout, wherein said processing system is configured to compare said first differential and said second differential, by virtue of being further configured to:

take as input a first fuzzy variable, said fuzzy variable representing said first differential, and a second fuzzy variable, said second fuzzy variable representing said second differential, combine said first and said second fuzzy variables to form a fuzzy output function, and analyze said fuzzy output function to produce a score for a placement of said second circuit element relative to said first circuit element, (vi) repeat steps (ii), (iii), (iv) and (v), where said second circuit element is selected from a second set of circuit elements, said second set of circuit elements comprising those circuit elements in said first set of circuit elements which have not yet been selected as said second circuit element, and (vii) repeat steps (i), (ii), (iii), (iv), (v) and (vi), where said first circuit element is selected from a first subset of the plurality of circuit elements, each one of said first subset of the plurality of circuit elements having not been selected as said first circuit element.

47. A computer program product for generating a physical layout of circuit elements, comprising:

a computer readable storage medium storing a computer program, the computer program comprising:

code that pre-processes the plurality of circuit elements in the template, wherein said code that pre-processes the plurality of circuit elements in the template further comprises:

(a) code that generates a list of circuit element pairs, each one of said circuit element pairs comprising a first circuit element and a second circuit element, (b) code that selects a circuit element pair from said list of circuit element pairs, (c) code that analyzes said circuit element pair to determine neighborhood information for said first and said second circuit elements of said circuit element pair, and (d) code that repeats code marked (b) and (c) for at least some circuit element pairs in said list of circuit element pairs; and code that evaluates a current placement of the plurality of circuit elements in the physical layout with regard to the positioning of the plurality of circuit elements in the template to arrive at an overall placement cost for said current placement of the plurality of circuit elements in the physical layout, wherein said code that evaluates said current placement of the plurality of circuit elements in the physical layout with regard to the positioning of the plurality of circuit elements in the template further comprises:

(a) code that selects a first circuit element from the plurality of circuit elements, (b) code that selects a second circuit element from a first set of circuit elements, said first set of circuit element being those circuit elements in a neighborhood of said first circuit element, (c) code that determines a first differential between a placement in the template of said first and said second circuit elements of said selected circuit element pair, wherein said code that determines said first differential further comprises:

(i) code that selects a fuzzy set from a plurality of fuzzy sets, the degree of membership in said set indicating the degree to which said second circuit element is in a given position relative to said first circuit element, (ii) code that determines a membership of said second circuit element in said fuzzy set to produce a fuzzy variable, and (iii) code that repeats code marked (i) and (ii) for selected sets in said plurality of fuzzy sets, (d) code that determines a second differential between a placement in the physical layout of said first and said second circuit elements from said selected circuit element pair, (e) code that compares said first differential and said second differential to arrive at a placement cost for said placement of said second circuit element in said physical layout, (f) code that repeats code marked (b), (c), (d) and (e), where said second circuit element is selected from a second set of circuit elements, said second set of circuit elements comprising those circuit elements in said first set of circuit elements which have not yet been selected as said second circuit element, and (g) code that repeats code marked (a), (b), (c), (d), (e) and (f), where said first circuit element is selected from a first subset of the plurality of circuit elements, each one of said first subset of the plurality of circuit elements having not been selected as said first circuit element.

48. A computer program product for generating a physical layout of circuit elements, comprising:

a computer readable storage medium storing a computer program, the computer program comprising:

code that pre-processes the plurality of circuit elements in the template, wherein said code that pre-processes the plurality of circuit elements in the template further comprises:

(a) code that generates a list of circuit element pairs, each one of said circuit element pairs comprising a first circuit element and a second circuit element, (b) code that selects a circuit element pair from said list of circuit element pairs, (c) code that analyzes said circuit element pair to determine neighborhood information for said first and said second circuit elements of said circuit element pair, and (d) code that repeats code marked (b) and (c) for at least some circuit element pairs in said list of circuit element pairs; and code that evaluates a current placement of the plurality of circuit elements in the physical layout with regard to the positioning of the plurality of circuit elements in the template to arrive at an overall placement cost for said current placement of the plurality of circuit elements in the physical layout, wherein said code that evaluates said current placement of the plurality of circuit elements in the physical layout with regard to the positioning of the plurality of circuit elements in the template further comprises:

(a) code that selects a first circuit element from the plurality of circuit elements, (b) code that selects a second circuit element from a first set of circuit elements, said first set of circuit element being those circuit elements in a neighborhood of said first circuit element, (c) code that determines a first differential between a placement in the template of said first and said second circuit elements of said selected circuit element pair, (d) code that determines a second differential between a placement in the physical layout of said first and said second circuit elements from said selected circuit element pair, (e) code that compares said first differential and said second differential to arrive at a placement cost for said placement of said second circuit element in said physical layout, (f) code that repeats code marked (b), (c), (d) and (e), where said second circuit element is selected from a second set of circuit elements, said second set of circuit elements comprising those circuit elements in said first set of circuit elements which have not yet been selected as said second circuit element, wherein said code that compares said first differential and said second differential further comprises:

code that takes as input a first fuzzy variable, said fuzzy variable representing said first differential, and a second fuzzy variable, said second fuzzy variable representing said second differential, code that combines said first and said second fuzzy variables to form a fuzzy output function, and code that analyzes said fuzzy output function to produce a score for a placement of said second circuit element relative to said first circuit element, and (g) code that repeats code marked (a), (b), (c), (d), (e) and (f), where said first circuit element is selected from a first subset of the plurality of circuit elements, each one of said first subset of the plurality of circuit elements having not been selected as said first circuit element.

* * * * *

UNITED STATES PATENT AND TRADEMARK OFFICE
CERTIFICATE OF CORRECTION

PATENT NO. : 5,768,479

DATED : June 16, 1998

INVENTOR(S) : Gadelkarim et al.

It is certified that error appears in the above-identified patent and that said Letters Patent is hereby corrected as shown below:

On the title page, item [19]

Gad El-Karim et al.

Item [75]

Inventors: George J. Gad El-Karim, Pleasanton;

Signed and Sealed this

Fifteenth Day of September, 1998

Attest:

BRUCE LEHMAN

Attesting Officer

Commissioner of Patents and Trademarks